US009691853B2

(12) United States Patent
Heo et al.

(10) Patent No.: US 9,691,853 B2
(45) Date of Patent: Jun. 27, 2017

(54) ELECTRONIC DEVICE INCLUDING GRAPHENE AND QUANTUM DOTS

(71) Applicant: Samsung Electronics Co., Ltd., Suwon-si, Gyeonggi-do (KR)

(72) Inventors: Jinseong Heo, Seoul (KR); Taeho Kim, Suwon-si (KR); Kiyoung Lee, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/600,888

(22) Filed: Jan. 20, 2015

(65) Prior Publication Data

US 2015/0364545 A1 Dec. 17, 2015

(30) Foreign Application Priority Data

Jun. 17, 2014 (KR) ........................ 10-2014-0073680

(51) Int. Cl.
*H01L 29/10* (2006.01)
*H01L 29/16* (2006.01)
(Continued)

(52) U.S. Cl.
CPC ...... *H01L 29/1033* (2013.01); *H01L 27/1222* (2013.01); *H01L 27/1443* (2013.01);
(Continued)

(58) Field of Classification Search
CPC ............. H01L 29/1033; H01L 27/1222; H01L 27/1443; H01L 27/156; H01L 29/0665; H01L 29/1606
(Continued)

(56) References Cited

U.S. PATENT DOCUMENTS 4,733,375 A * 3/1988 Terashima ............. G11C 5/147
365/104
7,629,639 B2 * 12/2009 Zhang .................... B82Y 10/00
257/317
(Continued)

FOREIGN PATENT DOCUMENTS

KR 20120029332 A 3/2012
KR 20120084177 A 7/2012
(Continued)

OTHER PUBLICATIONS

L. Britnell et al., Strong Light-Matter Interactions in Heterostructures of Atomically Thin Films, Science vol. 340, 1311, Jun. 14, 2013, pp. 1311-1314, DOI: 10.1126/science.1235547.
(Continued)

*Primary Examiner* — Ori Nadav
(74) *Attorney, Agent, or Firm* — Harness, Dickey & Pierce, P.L.C.

(57) ABSTRACT

According to example embodiments, an electronic device includes channel layer including a graphene layer electrically contacting a quantum dot layer including a plurality of quantum dots, a first electrode and a second electrode electrically connected to the channel layer, respectively, and a gate electrode configured to control an electric current between the first electrode and the second electrode via the channel layer. A gate insulating layer may be between the gate electrode and the channel layer.

25 Claims, 29 Drawing Sheets

(51) Int. Cl.

| | | |
|---|---|---|
| H01L 27/12 | (2006.01) | |
| H01L 27/144 | (2006.01) | |
| H01L 29/267 | (2006.01) | |
| H01L 29/778 | (2006.01) | |
| H01L 29/06 | (2006.01) | |
| H01L 27/15 | (2006.01) | |
| H01L 33/00 | (2010.01) | |
| H01L 29/786 | (2006.01) | |
| H01L 33/06 | (2010.01) | |
| H01L 33/34 | (2010.01) | |

(52) U.S. Cl.
CPC ........ *H01L 27/156* (2013.01); *H01L 29/0665* (2013.01); *H01L 29/1606* (2013.01); *H01L 29/267* (2013.01); *H01L 29/778* (2013.01); *H01L 29/78681* (2013.01); *H01L 29/78684* (2013.01); *H01L 33/0041* (2013.01); *H01L 33/06* (2013.01); *H01L 33/34* (2013.01)

(58) Field of Classification Search
USPC ............... 257/9, 13, 20, 21, 24, 29, 80, 82; 977/734, 742
See application file for complete search history.

(56) References Cited

U.S. PATENT DOCUMENTS

| | | | |
|---|---|---|---|
| 8,569,121 B2 | 10/2013 | Haensch et al. | |
| 8,698,226 B2 * | 4/2014 | Jain ................... | H01L 29/66977 257/317 |
| 8,772,141 B2 * | 7/2014 | Afzali-Ardakani ... | H01L 29/778 257/607 |
| 9,105,556 B2 | 8/2015 | Heo et al. | |
| 9,130,085 B2 * | 9/2015 | Colli ................. | H01L 31/03521 |
| 9,184,270 B2 * | 11/2015 | Nourbakhsh ........ | H01L 29/775 |
| 2007/0014151 A1 * | 1/2007 | Zhang ................... | B82Y 10/00 365/185.01 |
| 2007/0037347 A1 * | 2/2007 | Kim ....................... | B82Y 10/00 438/243 |
| 2008/0151603 A1 * | 6/2008 | Radosavljevic ....... | B82Y 10/00 365/151 |
| 2011/0278541 A1 * | 11/2011 | Huang .............. | H01L 31/02327 257/21 |
| 2012/0274882 A1 * | 11/2012 | Jung ................. | G02F 1/133617 349/96 |
| 2013/0032782 A1 | 2/2013 | Gerasimos et al. | |
| 2013/0057333 A1 * | 3/2013 | Wu ........................ | B82Y 10/00 327/530 |
| 2013/0175588 A1 * | 7/2013 | Kelber .............. | H01L 29/66984 257/295 |
| 2013/0193408 A1 * | 8/2013 | Hwang .................. | H01L 33/04 257/13 |
| 2014/0001494 A1 * | 1/2014 | Shen ...................... | H01L 33/08 257/84 |
| 2014/0097403 A1 | 4/2014 | Heo et al. | |
| 2014/0135680 A1 * | 5/2014 | Peyman ................. | A61N 5/062 604/20 |
| 2014/0231752 A1 | 8/2014 | Shin et al. | |
| 2014/0367901 A1 | 12/2014 | Matejko-Anger | |

FOREIGN PATENT DOCUMENTS

| | | |
|---|---|---|
| KR | 20120112087 A | 10/2012 |
| KR | 2013-0057279 A | 5/2013 |
| KR | 2014-0045841 A | 4/2014 |
| KR | 2014-0114055 A | 9/2014 |
| WO | WO-20120127244 A2 | 9/2012 |

OTHER PUBLICATIONS

Gerasimos Konstantatos et. al., Hybrid graphene-quantum dot phototransistors with ultrahigh gain, Published May 6, 2012, vol. 7, Jun. 2012, DOI: 10.1038/NNAN0.2012.60, pp. 363-368.

* cited by examiner

ELECTRONIC DEVICE INCLUDING GRAPHENE AND QUANTUM DOTS

RELATED APPLICATIONS

This application claims priority under 35 U.S.C. §119 to Korean Patent Application No. 10-2014-0073680, filed on Jun. 17, 2014, in the Korean Intellectual Property Office, the disclosure of which is incorporated herein in its entirety by reference.

BACKGROUND

1. Field

The present disclosure relates to electronic devices such as photodetectors, light emitting devices, and solar batteries, and more particularly, to electronic devices including graphene and/or quantum dots.

2. Description of Related Art

A quantum dot is a particle of a size that has a quantum confinement effect. A quantum dot may have various bandgaps according to its size, its material, and/or its structure thereof. A quantum dot may have an n-type or a p-type property without performing a doping process. Also, the quantum dot may be manufactured to a large area at low manufacturing costs. Owing to the above characteristics, quantum dots have been applied in a field of an optoelectronic device, for example, a photodetector, a light emitting device, and a solar battery. However, since the quantum dot has a low mobility, research to improve the mobility has been conducted.

Graphene is a material having a two-dimensional hexagonal structure in which carbon atoms are connected as a hexagon in a plane. Graphene has a very small thickness. For example, a thickness of graphene may correspond to a monoatomic layer. Since graphene has stable and excellent electrical/mechanical/chemical characteristics and an excellent conductivity, graphene is being considered as a next generation material. In particular, research onto manufacturing of electronic devices by using graphene, instead of silicon semiconductor, has been conducted. For example, a transistor using graphene as a channel layer by coupling graphene with another two-dimensional material or coupling graphene with a general semiconductor material has been developed.

SUMMARY

The present disclosure relates to electronic devices that may be manufactured to have a large area by using graphene and quantum dots and have a high mobility and a large on/off ratio.

Additional aspects will be set forth in part in the description which follows and, in part, will be apparent from the description, or may be learned by practice of example embodiments.

According to example embodiments, an electronic device includes: a channel layer including a graphene layer electrically contacting a quantum dot layer including a plurality of quantum dots; a first electrode and a second electrode electrically connected to the channel layer, respectively; a gate electrode configured to control an electric current between the first electrode and the second electrode via the channel layer; and a gate insulating layer between the gate electrode and the channel layer.

In example embodiments, the quantum dot layer may be on a partial region of the graphene layer, the first electrode may contact the quantum dot layer, and the second electrode may contact the graphene layer.

In example embodiments, the electronic device may further include at least one of a first transport layer and a second transport layer. The first transport layer may be between the graphene layer and the quantum dot layer and the second transport layer may be between the quantum dot layer and the first electrode.

In example embodiments, the quantum dot layer may include a plurality of first quantum dots and a plurality of second quantum dots that are different from the plurality of first quantum dots.

In example embodiments, the plurality of first quantum dots may be a first conductive type material and the plurality of second quantum dots may be a second conductive type material that is opposite to the first conductive type. A value of a conduction band of the plurality of first quantum dots may be less than a Fermi energy value of the graphene layer. A value of a valence band of the plurality of second quantum dots may be greater than the Fermi energy value of the graphene layer.

In example embodiments, the plurality of first quantum dots may contact a first region of the graphene layer, and the plurality of second quantum dots may contact a second region of the graphene layer that is different from the first region.

In example embodiments, at least one of the plurality of first quantum dots may be on top of a corresponding one of the plurality of second quantum dots.

In example embodiments, the plurality of first quantum dots and the plurality of second quantum dots may be randomly mixed, and each of the plurality of first quantum dots and the plurality of second quantum dots may contact the graphene layer.

In example embodiments, the plurality of first quantum dots may be stacked as multiple layers between the graphene layer and the first electrode, and the plurality of second quantum dots may be stacked as multiple layers between the graphene layer and the first electrode.

In example embodiments, the quantum dot layer may include a plurality of first pillars and a plurality of second pillars. Each one of the plurality of first pillars may be defined by a number of the plurality of first quantum dots stacked on top of each other. The plurality of first pillars may connect the graphene layer and the first electrode to each other, Each one of the plurality of second pillars may be defined by a number of the plurality of second quantum dots stacked on top of each other. The plurality of second pillars may connect the graphene layer and the first electrode to each other. The plurality of first pillars and the plurality of second pillars may be alternately arranged between the graphene layer and the first electrode.

In example embodiments, the quantum dot layer may include a plurality of first pyramid structures and a plurality of second pyramid structures. Each one of the plurality of first pyramid structures may be defined by a number of the plurality of first quantum dots. The plurality of first pyramid structures may connect the graphene layer and the first electrode to each other. Each one of the plurality of second pyramid structures may be defined by a number of the plurality of second quantum dots. The plurality of second pyramid structures may connect the graphene layer and the first electrode to each other. The plurality of first pyramid structures may be arranged to be complementary with the plurality of second pyramid structures.

In example embodiments, the electronic device may further include a substrate. The gate electrode may be on the substrate. The gate insulating layer may be on the gate electrode. The graphene layer may be on the gate insulating layer.

In example embodiments, the quantum dot layer may include a first quantum dot layer on a first region of the graphene layer and a second quantum dot layer on a second region of the graphene layer. The second region may be different from the first region. The first electrode may be on the first quantum dot layer and the second electrode may be on the second quantum dot layer.

In example embodiments, the electronic device may further include a substrate. The first electrode may be on a first region of a surface of the substrate. the quantum dot layer may be on the first electrode. The graphene layer may be on an upper surface of the quantum dot layer and a second region of the surface of the substrate. The second electrode may be on the graphene layer on the second region of the surface of the substrate. The gate insulating layer may be on the graphene layer on the upper surface of the quantum dot layer. The gate electrode may be on the gate insulating layer.

In example embodiments, some of the plurality of quantum dots in the quantum dot layer may have different bandgaps from each other.

In example embodiments, the quantum dot layer may be between the graphene layer and the first electrode. The quantum dot layer may include a plurality of first conductive type quantum dots contacting the graphene layer and a plurality of second conductive type quantum dots contacting the first electrode. The second conductive type may be opposite to the first conductive type. The plurality of second conductive type quantum dots may be stacked on the plurality of first conductive type quantum dots.

In example embodiments, the electronic device may be one of a photodetector, a light emitting device, and a photovoltaic device.

According to example embodiments, an image sensor includes a plurality of sensor pixels configured to sense light. The plurality of sensor pixels may be arranged in an array. Each of the plurality of sensor pixels may include one of the above-described electronic devices. The plurality of sensor pixels may include a first sensor pixel and a second sensor pixel having different absorption wavelengths from each other, based on an absorption wavelength of the plurality of quantum dots in the first sensor pixel being different than an absorption wavelength of the plurality of quantum dots in the second sensor pixel.

According to example embodiments, a display apparatus includes a plurality of display pixels configured to emit light. The plurality of display pixels may be arranged in an array. Each of the plurality of display pixels may include one of the above-described electronic devices. The plurality of display pixels may include a first display pixel and a display sensor pixel configured to emit light of different wavelengths from each other, based on an emission characteristic of the plurality of quantum dots in the first display pixel being different than an emission characteristic wavelength of the plurality of quantum dots in the second display pixel.

According to example embodiments, an image sensor includes a plurality of sensor pixels configured to sense light. The plurality of sensor pixels may be arranged in an array. The plurality of sensor pixels may include a first sensor pixel and a second sensor pixel having different absorption wavelengths from each other. Each one of the plurality of sensor pixels may include: a channel layer including a graphene layer electrically contacting a quantum dot layer including a plurality of quantum dots; a first electrode and a second electrode electrically connected to the channel layer, respectively; a gate electrode configured to control an electric current between the first electrode and the second electrode via the channel layer; and a gate insulating layer between the gate electrode and the channel layer.

According to example embodiments, a display apparatus includes a plurality of display pixels configured to emit light. The plurality of display pixels may be arranged in an array. The plurality of display pixels may include a first display pixel and a second display pixel configured to emit light of different wavelengths from each other. Each of the display pixels may include: a channel layer including a graphene layer electrically contacting a quantum dot layer including a plurality of quantum dots; a first electrode and a second electrode electrically connected to the channel layer, respectively; a gate electrode configured to control an electric current between the first electrode and the second electrode via the channel layer; and a gate insulating layer between the gate electrode and the channel layer.

According to example embodiments, a photovoltaic device includes a battery cell configured to convert light energy into electrical energy. The battery cell may include: a channel layer, a first electrode, and a second electrode. The channel layer may include a graphene layer electrically contacting a quantum dot layer including a plurality of quantum dots. At least two of the plurality of quantum dots may have different bandgaps from each other.

In example embodiments, the quantum dot layer may be on a partial region of the graphene layer. The first electrode may be contact the quantum dot layer and the second electrode may contact the graphene layer.

In example embodiments, the quantum dot layer may include a first quantum dot layer on a first region of the graphene layer and a second quantum dot layer on a second region of the graphene layer. The second region may be different from the first region. The first electrode may be on the first quantum dot layer and the second electrode may be on the second quantum dot layer.

In example embodiments, the quantum dot layer may include a plurality of quantum dots having different bandgaps.

According to example embodiments, an inverter device includes: a gate electrode; a gate insulating layer on the gate electrode; a first channel layer and a second channel layer spaced apart from each other on the gate insulating layer; a first electrode electrically connected to the first channel layer; a second electrode electrically connected to the second channel layer; and a third electrode electrically connected to both the first channel layer and the second channel layer. The first channel layer may include: a first graphene layer on the gate insulating layer; and a first quantum dot layer including a plurality of quantum dots and on a partial region of the first graphene layer. The second channel layer may include: a second graphene layer on the gate insulating layer to be spaced apart from the first graphene layer; and a second quantum dot layer including a plurality of quantum dots on a partial region of the second graphene layer.

In example embodiments, the first electrode may contact the first graphene layer, the second electrode may contact the second graphene layer, and the third electrode may contact both the first quantum dot layer and the second quantum dot layer.

In example embodiments, the inverter device may further include: a ground line electrically connected to the first electrode; a driving voltage line electrically connected to the second electrode; an input signal line electrically connected to the gate electrode; and an output signal line electrically connected to the third electrode.

According to example embodiments, an electronic device includes: a graphene layer, a quantum dot layer on one end of the graphene layer, a first electrode on the quantum dot layer, and a second electrode on an other end of the graphene layer. The second electrode is spaced apart from the first electrode and the quantum dot layer. The quantum dot layer includes a plurality of inorganic quantum dots.

In example embodiments, the electronic device may further include a gate electrode and a gate insulating layer between the gate electrode and the graphene layer. The graphene layer and the quantum dot layer may define a channel layer. The channel layer may contact the gate insulating layer. The gate insulating layer may contact the gate electrode. The gate electrode may be configured to control an electric current between the first electrode and the second electrode via the channel layer.

In example embodiments, the plurality of inorganic quantum dots may include a first plurality of inorganic quantum dots and a second plurality of inorganic quantum dots. At least one of a band gap and a material of the first plurality of quantum dots may be different than that of the second plurality of inorganic quantum dots.

In example embodiments, the electronic device may include at least one of a first transport layer and a second transport layer. The first transport layer may be on the graphene layer between the first electrode and the quantum dot layer. The second transport layer may be on the quantum dot layer.

In example embodiments, the graphene layer may be a first graphene layer. The quantum dot layer may be a first quantum dot layer. The electronic device may further include a second graphene layer spaced apart from the first graphene layer, a second quantum dot layer between the first electrode and the second graphene layer, and a third electrode on the second graphene layer. The second quantum dot layer may be spaced apart from the first quantum dot layer. The third electrode may be spaced apart from the first electrode and the second quantum dot layer.

In example embodiments, a photovoltaic device may include a battery cell configured to convert light energy into electrical energy. The battery cell may include one of the above-described electronic devices. The quantum dot layer and the graphene layer of the electronic device may define a channel layer of the battery cell. At least two of the plurality of inorganic quantum dots may have different bandgaps from each other. The first electrode and the second electrode may be electrically connected to the channel layer, respectively.

In example embodiments, an inverter device may include a gate electrode, a gate insulating layer on the gate electrode, one of the above-described electronic devices, a second channel layer, and a third electrode. The quantum dot layer of the electronic device may be a first quantum dot layer. The graphene layer of the electronic device may be a first graphene layer on the gate insulating layer. The first quantum dot layer and the first graphene layer may define a first channel layer. The second channel layer may be spaced apart from the first channel layer and electrically connected to the first channel layer by the first electrode. The second channel layer may include a second graphene layer and a second plurality of inorganic quantum dots. The second plurality of inorganic quantum dots may be between the second graphene layer and the first electrode. The third electrode may be on the second graphene layer and spaced apart from the first electrode and the second quantum dot layer.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
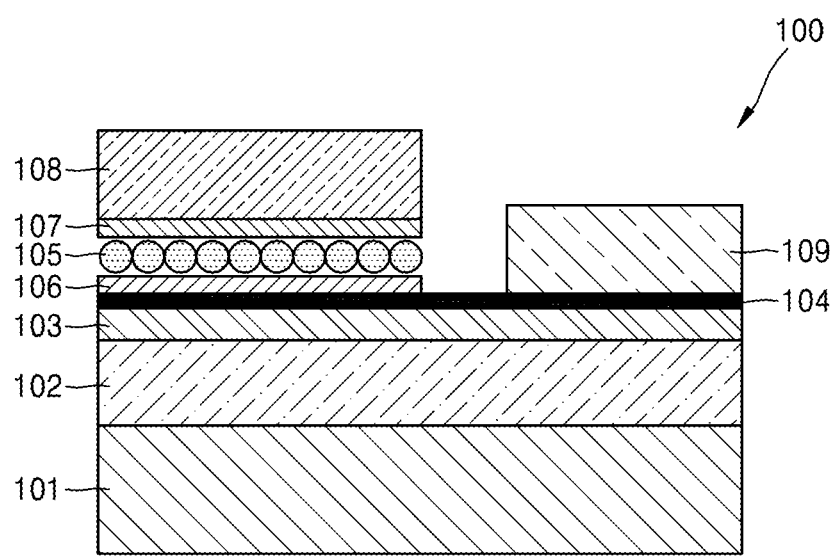
FIG. 1 is a schematic cross-sectional view of an electronic device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of an electronic device 100 according to example embodiments. Referring to FIG. 1, the electronic device 100 includes a substrate 101, a gate electrode 102 disposed on the substrate 101, a gate insulating layer 103 disposed on the gate electrode 102, a graphene layer 104 disposed on the gate insulating layer 103, a quantum dot layer 105 disposed on a partial region of the graphene layer 104, a drain electrode 108 disposed on the quantum dot layer 105, and a source electrode 109 disposed on the graphene layer 104. In addition, the electronic device 100 may further include a first transport layer 106 that is disposed between the quantum dot layer 105 and the graphene layer 104 and a second transport layer 107 disposed between the quantum dot layer 105 and the drain electrode 108.

The substrate 101 may be formed of a material such as glass, sapphire, and/or plastic material, but example embodiments are not limited thereto. If desired, the substrate 101 may be formed of a transparent material that may transmit light such as visible light, ultraviolet rays, and infrared rays. Also, in example embodiments, the electronic device 100 may not include a semiconductor material based on silicon, and thus may be fabricated to be flexible. In this case, the substrate 101 may be formed of a material having flexibility or elasticity. However, the electronic device 100 does not require the substrate 101, and the substrate 101 may be removed after finishing manufacturing of the electronic device 100.

The gate electrode 102, the drain electrode 108, and the source electrode 109 may be formed of any type of material having conductivity. For example, the gate electrode 102, the drain electrode 108, and the source electrode 109 may be formed of metal, conductive metal oxide, or graphene. The gate electrode 102 and the drain electrode 108 may be formed of a transparent conductive material so that light may be incident to or emitted from the quantum dot layer 105. The gate electrode 102 and the drain electrode 108 may be transparent electrodes formed of transparent conductive oxides. For example, the gate electrode 102 and the drain electrode 108 may be formed of indium tin oxide (ITO), indium zinc oxide (IZO), aluminum zinc oxide (AZO), or gallium zinc oxide (GZO). The gate electrode 102 and the drain electrode 108 may be formed of the same material or different materials.

The gate insulating layer 103 may be formed of a gate insulating material of a general semiconductor transistor, for example, $SiO_2$, $SiN_x$, $fO_2$, $Al_2O_3$, $La_2O_3$, $ZrO_2$, HfSiO, HfSiON, HfLaO, LaAlO, and SrTiO. Also, the gate insulating layer 103 may be formed of a two-dimensional material of a hexagonal system, such as hexagonal BN (h-BN), in order to increase a coupling property with the graphene layer 104. If the gate insulating layer 103 includes h-BN, the h-BN gate insulating layer 103 and the graphene layer 104 on the gate electrode 102 may be sequentially formed in a direct growth method, or may be sequentially formed in a general transfer method.

The quantum dot layer 105 includes a plurality of quantum dots. A quantum dot is a particle of a size having a quantum confinement effect. For example the quantum dot layer 105 may include a particle of compound semiconductor (e.g., Group III-V semiconductor, Group II-Semiconductor) and/or a particle of a Group IV semiconductor. A quantum dot may be formed of an inorganic semiconductor. For example, the quantum dot layer 105 may include a particle formed of InP, PbS, CdTe, CdSe, ZnS, and/or CdS, but example embodiments are not limited thereto. Each quantum dot may have a diameter of about, for example, 4 nm to about 20 nm, but is not limited thereto. Also, in the quantum dot layer 105, each quantum dot may have a single structure or a dual structure of a core-shell type. Quantum dots having various core-shell structures have been suggested, for example, CdSe/AsS, CdTe/CdSe, and CdSe/ZnS structures. Also, each quantum dot in the quantum dot layer 105 may have a hollow spherical shell shape such as a graphene quantum dot. Various bandgaps may be obtained according to materials, sizes, and structures of the quantum dots. Therefore, the materials, sizes, and structures of the quantum dots may be selected according to a desired emission wavelength or absorbing wavelength.

In FIG. 1, in the quantum dot layer 105, the plurality of quantum dots are arranged in a monolayer; however, example embodiments are not limited thereto. The plurality of quantum dots may be arranged in multilayered structure. The quantum dot layer 105 in which the quantum dots are arranged in the multilayered structure may have a thickness of about 200 nm or less. The quantum dots may be easily transferred onto the graphene layer 104 from another substrate (not shown) by using a stamp such as a polydimethylsiloxane (PDMS) stamp. The quantum dots may be stacked in a desired pattern by one layer on the graphene layer 104 by using the PDMS stamp. Thus, the quantum dot layer 105 may be formed in the single layered or multilayered structure.

As shown in FIG. 1, the quantum dot layer 105 may be disposed only on a partial region of the graphene layer 104. In addition, the drain electrode 108 may be disposed to electrically contact the quantum dot layer 105 and the source electrode 109 may be disposed to electrically contact the graphene layer 104. For example, the source electrode 109 may be directly disposed on a remaining region of the graphene layer 104, on which the quantum dot layer 105 is not formed.

The first transport layer 106 disposed between the quantum dot layer 105 and the graphene layer 104 and the second transport layer 107 disposed between the quantum dot layer 105 and the drain electrode 108 may help transfer of electrons or holes. For example, a material of an electron transport layer or a hole transport layer generally used in an organic light emitting device (OLED), for example, NPB or $Alq_3$, may be used to form the first and second transport layers 106 and 107. Also, $Al_2O_3$ or h-BN formed may be used as the first and second transport layers 106 and 107 by using an atomic layer deposition (ALD) method.

In the electronic device 100 according to example embodiments, when a gate voltage is applied to the gate electrode 102 while applying a voltage between the drain electrode 108 and the source electrode 109, an electric current flowing between the drain electrode 108 and the source electrode 109 may be adjusted according to the gate voltage. In this point of view, operating principles of the electronic device 100 according to example embodiments may equal to those of a vertical graphene heterostructure transistor. For example, the electric current may flow from the source electrode 109 to the drain electrode 108 through the graphene layer 104 and the quantum dot layer 105. Here, the flow of electric current may be adjusted by the gate electrode 102, that is, a work function of the graphene layer 104 is changed according to the gate voltage applied to the gate electrode 102 to adjust an energy barrier between the graphene layer 104 and the quantum dot layer 105. If the gate electrode 102 increases the energy barrier, less electric current flows, and if not, more electric current flows.

Thus, in example embodiments, the graphene layer 104 and the quantum dot layer 105 function as a channel layer of the electronic device 100. Therefore, the drain electrode 108 and the source electrode 109 electrically contact the channel layer including the graphene layer 104 and the quantum dot layer 105, respectively. In addition, the gate insulating layer 103 is disposed between the gate electrode 102 and the channel layer. The gate electrode 102 may control the electric current flowing between the drain electrode 108 and the source electrode 109 via the channel layer including the graphene layer 104 and the quantum dot layer 105.

In addition, the electronic device 100 according to example embodiments may operate as an n-type or a p-type according to materials of the plurality of quantum dots arranged in the quantum dot layer 105. That is, if the quantum dots are the n-type, the electronic device 100 operates as an n-type transistor, and if the quantum dots are the p-type, the electronic device 100 may operate as a p-type transistor. The n-type quantum dots may be formed of, for example, InP, CdS, and CdSe, a conduction band may range from about 4 eV to about 4.5 eV that is less than Fermi energy (about to 4.5 eV) of the graphene layer 104. Also, the p-type quantum dots may be formed of, for example, PbS, a valence band may range from about 4.5 eV to about 5 eV that is greater than Fermi energy of the graphene layer 104. When the electronic device 100 is the n-type, the electronic device 100 is turned on when the gate voltage is positive, and when the electronic device 100 is the p-type, the electronic device 100 may be turned on when the gate voltage is negative.

Figure 2A:
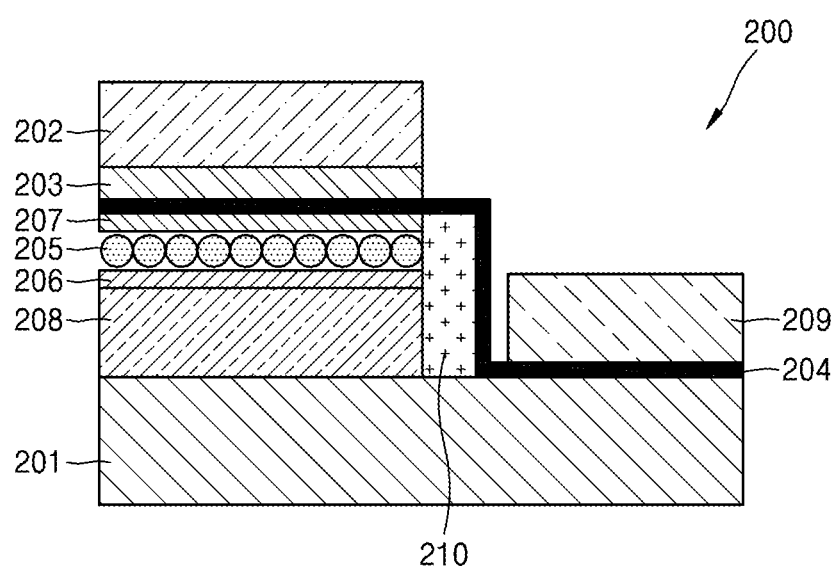
FIGS. 2A through 2C are schematic cross-sectional views of an electronic device according to example embodiments.

FIG. 2A is a schematic cross-sectional view of an electronic device 200 according to example embodiments. The electronic device 100 of FIG. 1 has a bottom gate structure, whereas the electronic device 200 of FIG. 2A has a top gate structure. Referring to FIG. 2A, the electronic device 200 includes a substrate 201, a drain electrode 208 disposed on a first surface region of the substrate 201, a quantum dot layer 205 disposed on the drain electrode 208, a graphene layer 204 disposed on an upper surface of the quantum dot layer 205 and a second surface region of the substrate 201, which is different from the first surface region of the substrate 201, a source electrode 209 disposed on the graphene layer 204 on the second surface region of the substrate 201, a gate insulating layer 203 disposed on the graphene layer 204 on the upper surface of the quantum dot layer 205, and a gate electrode 202 disposed on the gate insulating layer 203. Also, the electronic device 200 may further include a first transport layer 206 disposed between the quantum dot layer 205 and the drain electrode 208 and a second transport layer 207 disposed between the quantum dot layer 205 and the graphene layer 204.

As shown in FIG. 2A, the graphene layer 204 may be formed from the second surface region of the substrate 201 to the upper surface of the quantum dot layer 205 to have a step. Here, the graphene layer 204 may be separated a predetermined distance from a mesh-structured side surface including the drain electrode 208 and the quantum dot layer 205, so that a part of the graphene layer 204 may not directly contact the quantum dots and a side surface of the drain electrode 208. For example, the electronic device 200 may further include an insulating layer 210 disposed at side surfaces of the drain electrode 208 and the quantum dot layer 205. Then, the graphene layer 204 may extend from the second surface region of the substrate 201 to the upper surface of the quantum dot layer 205 along a side surface of the insulating layer 210 without directly contacting the quantum dots and the side surface of the drain electrode 208.

Figure 2B:
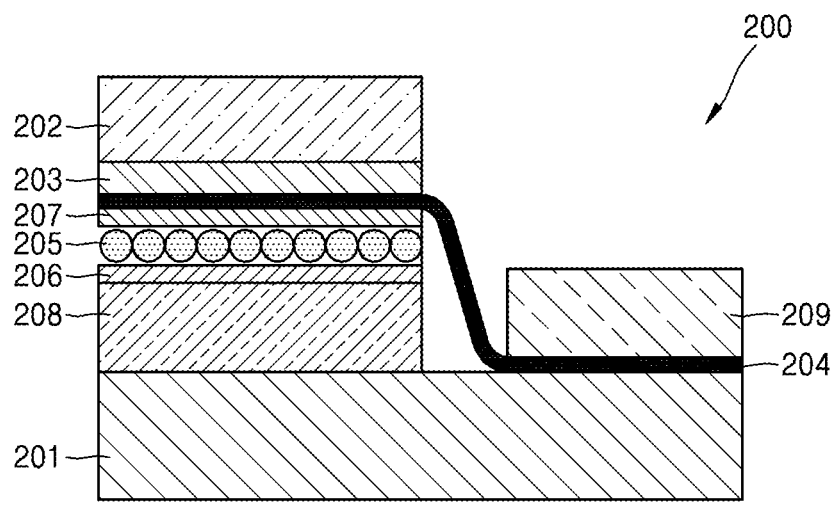
Figure 2C:
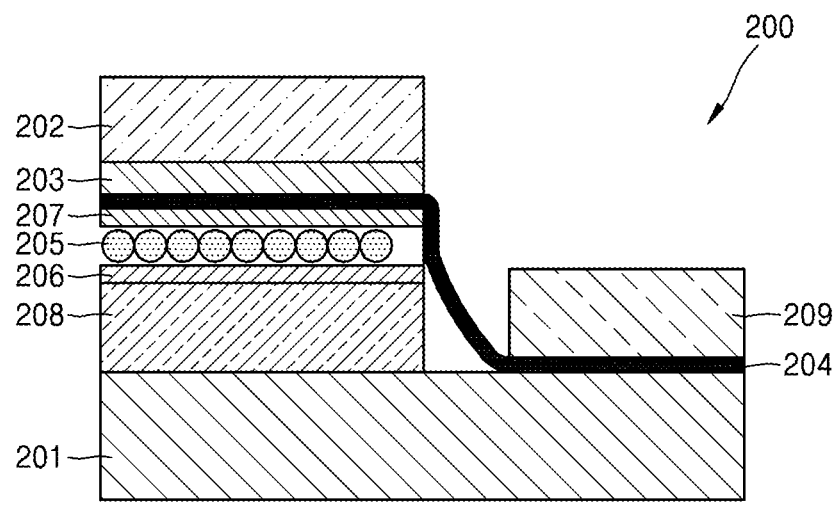

The insulating layer 210 may be omitted as shown in FIG. 2B, provided that the graphene layer 204 may not directly contact the quantum dots and the side surface of the drain electrode 208 even if there is no insulating layer 210. Then, the graphene layer 204 is sagged down to the second surface region of the substrate 201. In addition, if there is a possibility that the sagged part of the graphene layer 204 may directly contact the quantum dots of the quantum dot layer 205, as shown in FIG. 2C, the quantum dots located at an edge of the quantum dot layer 205 may be removed. Then, even if the graphene layer 204 partially contacts the side surface of the quantum dot layer 205, the graphene layer 204 does not directly contact the quantum dots.

Descriptions about the materials and characteristics of the gate electrode 102, the gate insulating layer 103, the graphene layer 104, the quantum dot layer 105, the first transport layer 106, the second transport layer 107, the drain electrode 108, and the source electrode 109 shown in FIG. 1 may be applied to the gate electrode 202, the gate insulating layer 203, the graphene layer 204, the quantum dot layer 205, the first transport layer 206, the second transport layer 207, the drain electrode 208, and the source electrode 209 shown in FIGS. 2A through 2C. Also, operating principles of the electronic device 200 shown in FIGS. 2A through 2C may be the same as those of the electronic device 100 shown in FIG. 1. Hereinafter, various applications based on the electronic device 100 of FIG. 1 will be described below; however, the descriptions below may be applied to the electronic device 200 of FIGS. 2A through 2C.

The electronic device 100 of FIG. 1 may have a switching function of a transistor and a function of a photoelectronic device. For example, the quantum dot layer 105 absorbs external light having a wavelength corresponding to the bandgap of the plurality of quantum dots arranged in the quantum dot layer 105 or less and generates excitons that are pairs of electrons and holes. The wavelength of the absorbed light may vary depending on the sizes, materials, and structures of the quantum dots, and may range from about 400 nm to about 2000 nm. Then, the electrons and holes may be separated and moved respectively to the drain electrode 108 and the source electrode 109. According to the energy band structures between the drain electrode 108 and the quantum dot layer 105 and between the quantum dot layer 105 and the graphene layer 104, the electrons move to the drain electrode 108 and the holes move to the source electrode 109, or the holes move to the drain electrode 108 and the electrons move to the source electrode 109.

Movement of the electrons and holes may be controlled according to the gate voltage applied to the gate electrode 102. For example, if the gate voltage is not applied, the electrons and holes may not move to the drain electrode 108 and the source electrode 109 even when the excitons are generated. When the gate voltage is applied to the gate electrode 102 and the electronic device 100 is turned on, the electrons and the holes may move to the drain electrode 108 and the source electrode 109. Transfer amounts of the electrons and holes may be changed according to a magnitude of the gate voltage.

Therefore, the electronic device 100 may function as a photodetector or a phototransistor by detecting electric currents generated when the electrons and holes move to the drain electrode 108 and the source electrode 109. Also, the electric current generated when the electrons and holes move to the drain electrode 108 and the source electrode 109 may be connected to an external load, and at this time, the electronic device 100 may operate as a photovoltaic device.

On the other hand, when a voltage is applied between the drain electrode 108 and the source electrode 109, electrons and holes are combined with each other in the quantum dots in the quantum dot layer 105 to emit light. A wavelength of the emitted light may vary depending on the sizes, materials, and structures of the quantum dots. Assuming that the voltage applied between the drain electrode 108 and the source electrode 109 constantly maintain, whether to emit light and an intensity of the emitted light may be controlled by the gate voltage applied to the gate electrode 102. Here, the electronic device 100 may operate as a light emitting device. Therefore, the electronic device 100 may be applied to a field of photoelectronic devices, such as a photovoltaic device, a photodetector, a phototransistor, and a light emitting device.

As described above, since the electronic devices 100 and 200 according to the above embodiments use the quantum dots having excellent photoelectronic characteristics and graphene having excellent mobility as the channel layer, and thus, have excellent characteristics. For example, the electronic devices 100 and 200 have a very wide bandgap ranging from the visible ray (400 nm to 700 nm) and infrared ray (to 2000 nm) according to the sizes, materials, and structures of the quantum dots. Also, since a light absorbing rate increases in proportional to an increase in a thickness of the quantum dot layer 105 or 205, and thus, the light absorbing rate may be easily increased. Also, the electronic devices 100 and 200 have high mobility and a large on/off ratio, so as to make it possible to realize a photoelectronic device having excellent performances. Moreover, the electronic devices 100 and 200 according to the embodiments only include the quantum dots and the graphene without including a general semiconductor material, and thus, may be manufactured to a large area easily at low manufacturing costs.

Figure 3:
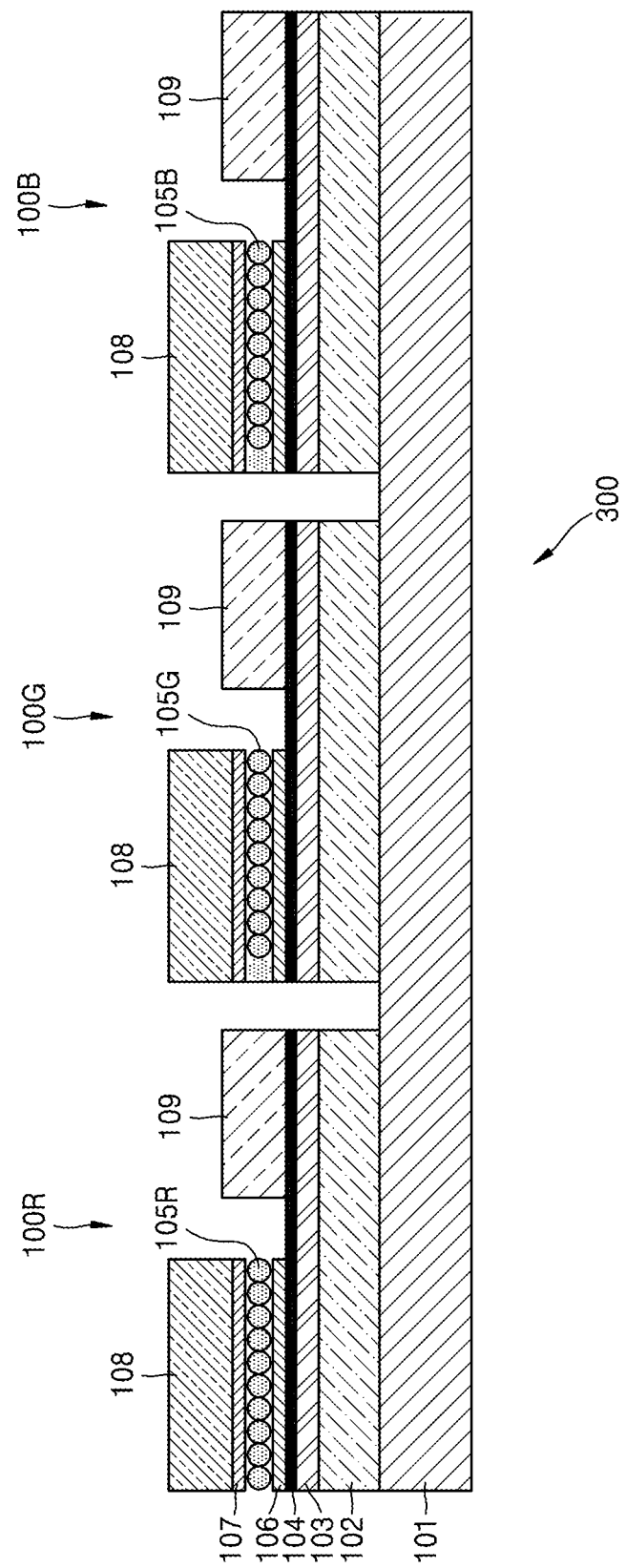
FIG. 3 is a schematic cross-sectional view of an electronic device array including a plurality of the electronic devices shown in FIG. 1.

In addition, a plurality of electronic devices 100 may be arranged in a two-dimensional array so as to realize a color image sensor or a color display apparatus. For example, FIG. 3 is a schematic cross-sectional view of an electronic device array 300 including a plurality of the electronic devices 100 shown in FIG. 1. Referring to FIG. 3, the electronic device array 300 may include a first electronic device 100R, a second electronic device 100G, and a third electronic device 100B arranged on the substrate 101. In FIG. 3, three electronic devices 100R, 100G, and 100B are shown for convenience of description; however, a lot of electronic devices 100R, 100G, and 100B may be repeatedly arranged in two-dimensional arrays.

The first through third electronic devices 100R, 100G, and 100B may have a structure that is the same as the electronic device 100 shown in FIG. 1. Instead of using the electronic device 100 of FIG. 1, the electronic device 200 shown in FIGS. 2A through 2C may be used. The first through third electronic devices 100R, 100G, and 100B have the same structures as each other, except for bandgaps of quantum dot layers 105R, 105G, and 105B. For example, a first quantum dot layer 105R of the first electronic device 100R may have a bandgap corresponding to red light, a second quantum dot layer 105G of the second electronic device 100G may have a bandgap corresponding to green light, and a third quantum dot layer 105B of the third electronic device 100B may have a bandgap corresponding to blue light. The first through third quantum dot layers 105R, 105G, and 105B may be simultaneously formed on the graphene layer in a stamp method or a printing method.

If the first through third electronic devices 100R, 100G, and 100B of the electronic device array 300 operate as photodetectors or phototransistors, the electronic device array 300 may be an image sensor generating images by detecting red, green, and blue light components from incident light. In addition, the first through third electronic devices 100R, 100G, and 100B may be sensor pixels having different absorption wavelengths. Also, if the first through third electronic devices 100R, 100G, and 100B of the electronic device array 300 operates as light emitting devices, the electronic device array 300 may be a display apparatus for displaying images by emitting red, green, and blue light. In addition, the first through third electronic devices 100R, 100G, and 100B may be display pixels having different emission wavelengths.

Even though FIG. 3 describes a non-limiting example where the first through third electronic devices 100R, 100G, and 100B of electronic device array 300 may be display pixels where the band gaps of the quantum dot layers in the first through third electronic devices 100R, 100G, and 100B correspond to red line, green light, and blue light, respectively, example embodiments are not limited thereto. Alternatively, an electronic device may include an array electronic devices where the quantum dot layers have band gaps corresponding to other wavelengths of light such as cyan, magenta, and yellow.

FIGS. 4A through 4D are schematic cross-sectional views illustrating processes of manufacturing the electronic device 100 of FIG. 1. In FIGS. 4A through 4D, the substrate 101 is omitted for convenience of description.

Figure 4A:
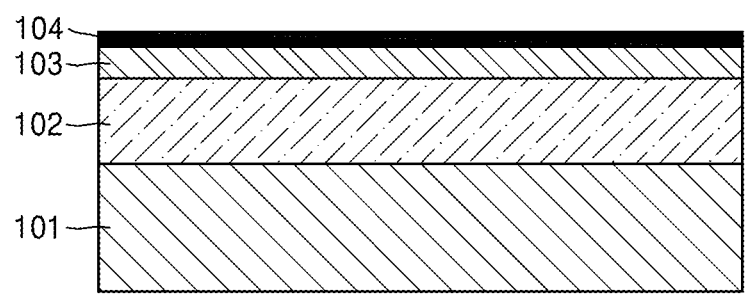
FIGS. 4A through 4D are schematic cross-sectional views illustrating processes of manufacturing the electronic device of FIG. 1.

Referring to FIG. 4A, the gate insulating layer 103 is stacked on the gate electrode 102, and the graphene layer 104 is stacked on the gate insulating layer 103. The gate insulating layer 103 may be formed by using a general deposition method. In addition, the graphene layer 104 may be separately fabricated, and then, may be transferred onto the gate insulating layer 103. As another method, after the gate electrode 102 is formed of metal such as nickel (Ni) or copper (Cu), or after Ni or Cu is deposited on the gate electrode 102, h-BN is grown as the gate insulating layer 103 and the graphene layer 104 may be grown on the h-BN gate insulating layer 103 by using a chemical vapor deposition (CVD) method.

Figure 4B:
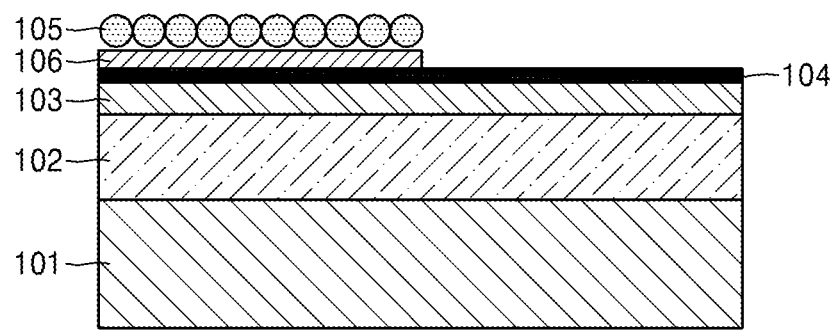

Next, referring to FIG. 4B, the quantum dot layer 105 may be stacked on the graphene layer 104. The quantum dot layer 105 may be formed by using a PDMS stamp method or a printing method. For example, colloid quantum dots, that is, quantum dots distributed in an organic polymer solution, is applied on an external substrate (not shown), and then, a stamp having a shape of the quantum dot layer 105 is impressed in the colloid quantum dots so as to be stained with the quantum dots. Then, the stamp is imprinted on the graphene layer 104 so as to transfer the quantum dots stained on a surface of the stamp onto the graphene layer 104. Also, before forming the quantum dot layer 105, the first transport layer 106 may be formed and patterned on the graphene layer 104, and then, the quantum dot layer 105 may be stacked on the first transport layer 106.

Figure 4C:
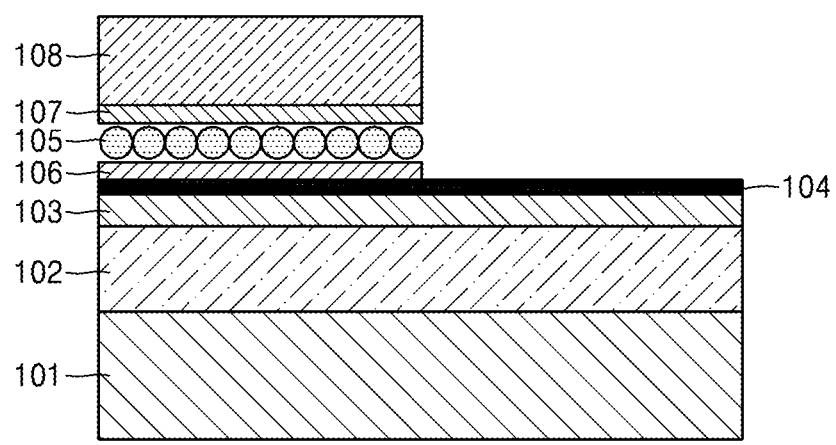

Next, as shown in FIG. 4C, the drain electrode 108 may be formed on the quantum dot layer 105. For example, a material of the drain electrode 108 may be entirely deposited on the quantum dot layer 105 and the graphene layer 104, and then, the electrode material except for that remaining on the quantum dot layer 105 may be etched and removed. In addition, before forming the drain electrode 108, the second transport layer 107 may be formed and patterned on the quantum dot layer 105, and then, the drain electrode 108 may be formed on the second transport layer 107.

Figure 4D:
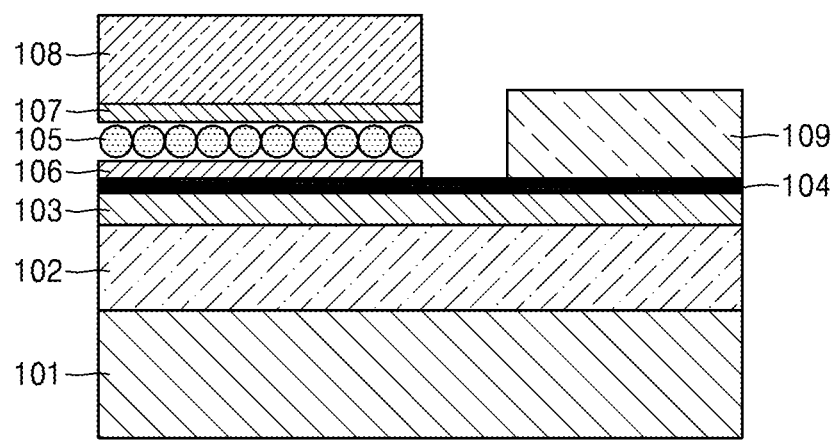

After that, as shown in FIG. 4D, the source electrode 109 may be formed on the graphene layer 104. Processes shown in FIGS. 4C and 4D may be performed sequentially if the drain electrode 108 and the source electrode 109 are formed of different materials from each other. For example, the drain electrode 108 may be formed of a transparent conductive material and the source electrode 109 may be formed of a general metal material. However, if the drain electrode 108 and the source electrode 109 are formed of the same material, the drain electrode 108 and the source electrode 109 may be formed by performing one manufacturing process. For example, after depositing an electrode material entirely on the quantum dot layer 105 and the graphene layer 104, the electrode material may be divided into two parts through an etching process to form the drain electrode 108 and the source electrode 109.

Figure 5:
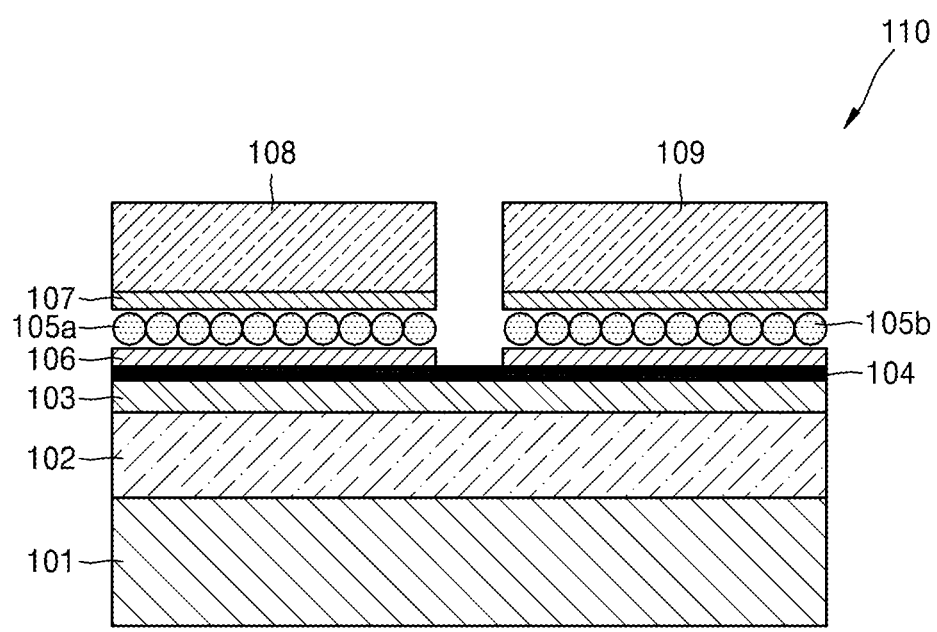
FIG. 5 is a schematic cross-sectional view of an electronic device according to example embodiments.

So far, it is described that the quantum dot layer 105 is only disposed between the graphene layer 104 and the drain electrode 108; however, example embodiments are not limited thereto. The quantum dot layer 105 may be disposed between the graphene layer 104 and the source electrode 109, or may be disposed between the graphene layer 104 and the drain electrode 108 and between the graphene layer 104 and the source electrode 109. For example, FIG. 5 is a schematic cross-sectional view of an electronic device 110 according to example embodiments. In FIG. 5, quantum dot layers 105a and 105b, that is, first and second quantum dot layers 105a and 105b, are respectively disposed between the graphene layer 104 and the drain electrode 108 and between the graphene layer 104 and the source electrode 109. In the embodiment of FIG. 5, the first quantum dot layer 105a may be disposed on a first region of the graphene layer 104 and the second quantum dot layer 105b may be disposed on a second region of the graphene layer 104, which is different from the first region. The drain electrode 108 is disposed on the first quantum dot layer 105a, and the source electrode 109 may be disposed on the second quantum dot layer 105b. Here, the plurality of quantum dots arranged respectively in the first and second quantum dot layers 105a and 105b may be identical with each other, or may be different from each other.

Figure 6:
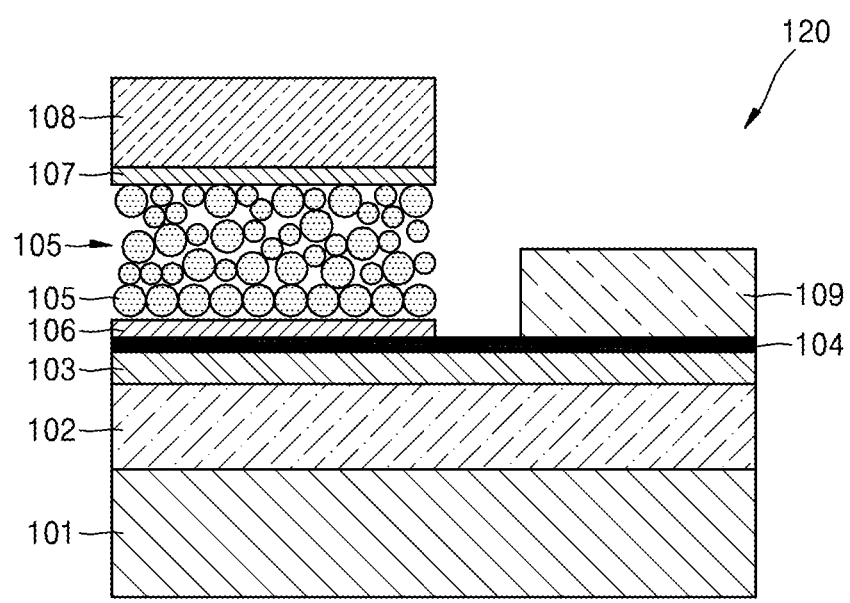
FIG. 6 is a schematic cross-sectional view of an electronic device according to example embodiments.

FIG. 6 is a schematic cross-sectional view of an electronic device 120 according to example embodiments, for operating the electronic device 120 as a photovoltaic cell. Referring to FIG. 6, the electronic device 120 may include the gate electrode 102, the gate insulating layer 103 disposed on the gate electrode 102, the graphene layer 104 disposed on the gate insulating layer 103, the quantum dot layer 105 disposed on a partial region of the graphene layer 104, the drain electrode 108 disposed on the quantum dot layer 105, and the source electrode 109 disposed on another partial region of the graphene layer 104. Here, the graphene layer 104 and the quantum dot layer 105 may perform as a channel layer through which an electric current flows.

In the electronic device 120 of FIG. 6, the quantum dot layer 105 has a multi-layered structure, and may include a plurality of quantum dots having different bandgaps from each other. For example, in the quantum dot layer 105, a plurality of quantum dots having various bandgaps for absorbing light of various wavelengths, that is, from visible ray to infrared ray, may be evenly distributed. Also, the plurality of quantum dots are stacked in the multi-layered structure to increase an absorbing rate of light. In order to further increase the absorbing rate of the light, the quantum dot layer 105b may be disposed between the graphene layer 104 and the source electrode 109 as shown in FIG. 5.

The electronic device 120 may perform as a battery cell for converting light energy into electric energy, and a photovoltaic cell may be configured by arranging a plurality of the electronic devices 120. In a case of the photovoltaic cell, if there is no need to switch each of battery cells independently, the gate electrode 102 and the gate insulating layer 103 in FIG. 6 may be omitted, and then, the graphene layer 104 may be directly disposed on the substrate 101. Otherwise, in order to improve a coupling property of the graphene layer 104, the h-BN gate insulating layer 103 may be formed on the substrate 101 and the graphene layer 104 may be disposed on the gate insulating layer 103.

Figure 7A:
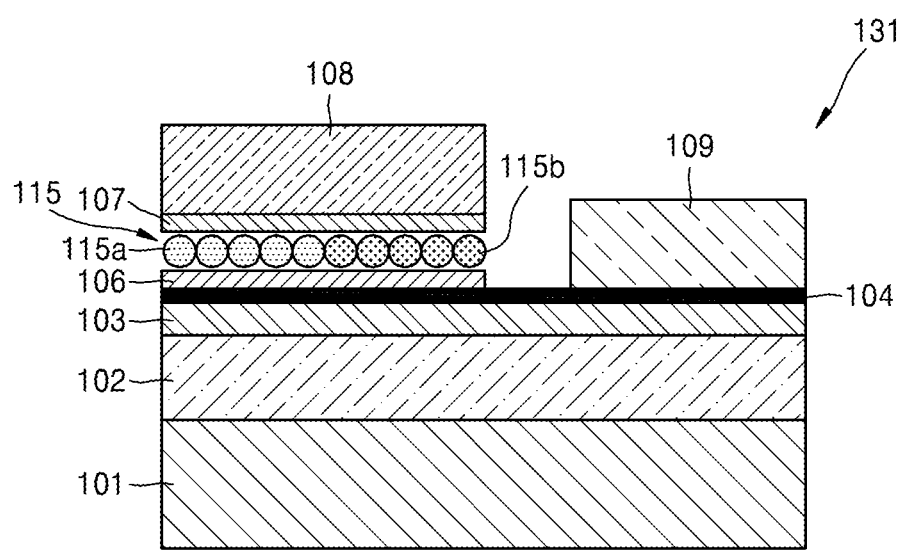
FIGS. 7A through 7C are schematic cross-sectional views of various electronic devices according to example embodiments.
Figure 7B:
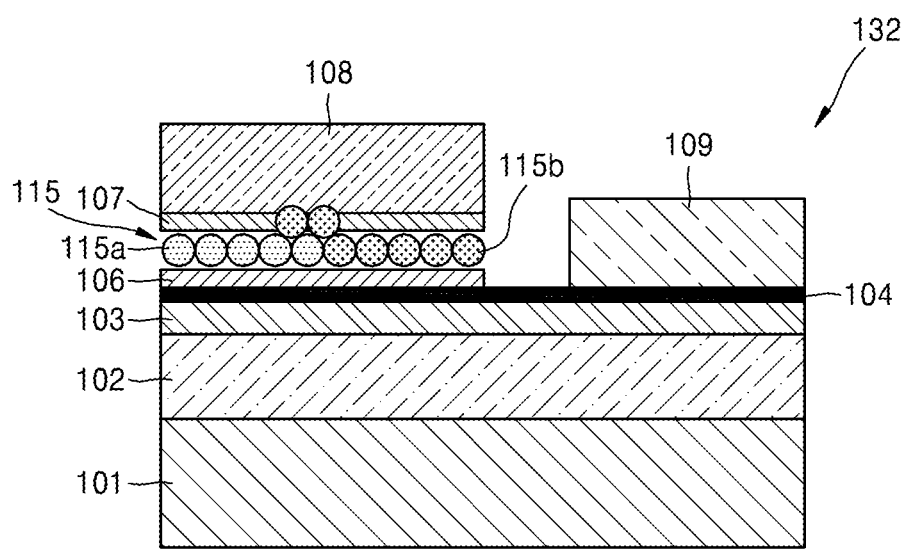
Figure 7C:
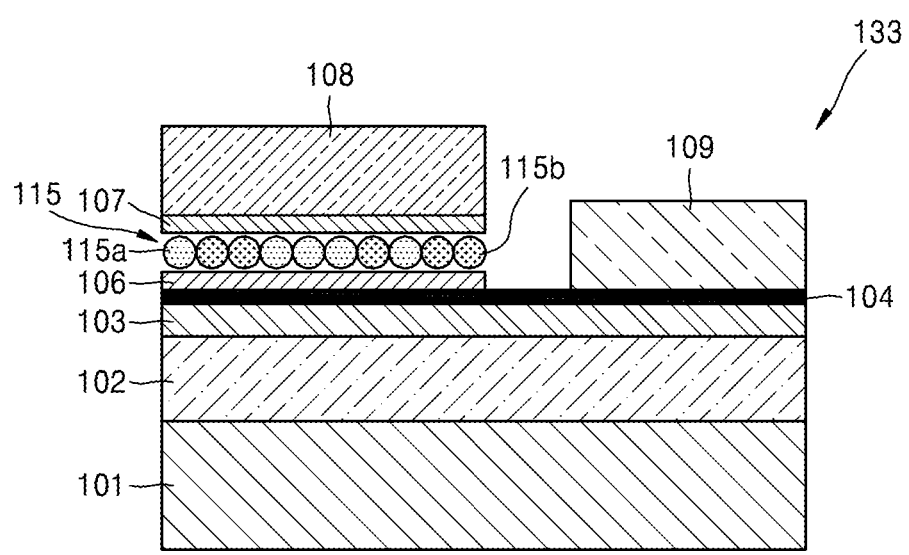

FIGS. 7A through 7C are schematic cross-sectional views of electronic devices 131, 132, and 133 according to embodiments. The electronic devices 131, 132, and 133 shown in FIGS. 7A through 7C may include a quantum dot layer 115 including a plurality of n-type quantum dots 115a and a plurality of p-type quantum dots 115b. Other structures of the electronic devices 131, 132, and 133 may be the same as that of the electronic device 100 of FIG. 1.

Referring to FIG. 7A, the quantum dot layer 115 of the electronic device 131 may include the plurality of n-type quantum dots 115a gathered together in a partial region so as to contact a partial region of the graphene layer 104, and the plurality of p-type quantum dots 115b that are gathered together in another partial region so as to contact another partial region of the graphene layer 104. For example, a value of a conduction band of the plurality of n-type quantum dots 115a may be less than Fermi energy value of the graphene layer 104, and a value of a valence band of the plurality of p-type quantum dots 115b may be greater than the Fermi energy value of the graphene layer 104.

In addition, referring to FIG. 7B, the quantum dot layer 115 of the electronic device 132 is similar to that of the electronic device 131 shown in FIG. 7A, except that some of the plurality of p-type quantum dots 115b overlap with some of the plurality of n-type quantum dots 115a. For example, some of the plurality of p-type quantum dots 115b may be arranged over the plurality of n-type quantum dots 115a to overlap with some of the plurality of n-type quantum dots 115a. Otherwise, some of the plurality of n-type quantum dots 115a may be arranged over the plurality of p-type quantum dots 115b to overlap with some of the plurality of p-type quantum dots 115b.

Referring to FIG. 7C, in the quantum dot layer 115 of the electronic device 133, the plurality of n-type quantum dots 115a and the plurality of p-type quantum dots 115b are randomly mixed within a layer. In addition, the plurality of n-type quantum dots 115a and the plurality of p-type quantum dots 115b may be arranged as a single layer so as to respectively contact the graphene layer 104.

In the electronic devices 131, 132, and 133 shown in FIGS. 7A through 7C, the n-type quantum dots 115a and the p-type quantum dots 115b in the quantum dot layer 115 all contact the graphene layer 104, and thus, the electronic devices 131, 132, and 133 may act as ambipolar devices. For example, when a predetermined voltage is applied between the drain electrode 108 and the source electrode 109, the electronic devices 131, 132, and 133 may be turned on in both cases where a positive voltage is applied to the gate electrode 102 and a negative voltage is applied to the gate electrode 102, provided that a magnitude of the positive or negative voltage is small and a leakage current in a forward direction is small. Since the electronic devices 131, 132, and 133 include two kinds of quantum dots 115a and 115b, wavelength band ranges of the absorbing light become greater than that of the electronic device 100 of FIG. 1, and thereby improving efficiency of the electronic devices 131, 132, and 133.

Figure 8A:
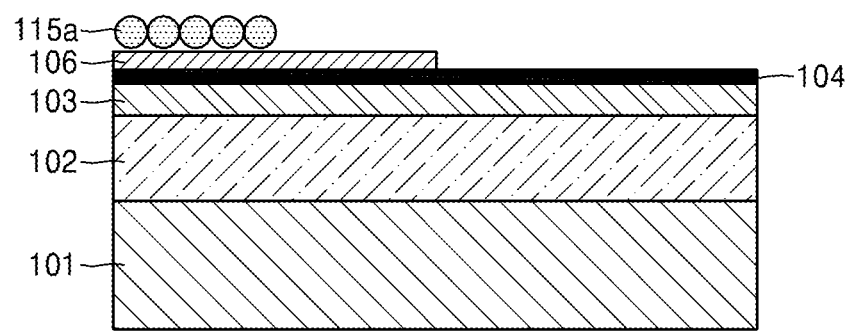
FIGS. 8A and 8B are schematic cross-sectional views illustrating processes of forming a quantum dot layer in the electronic device of FIG. 7A.
Figure 8B:
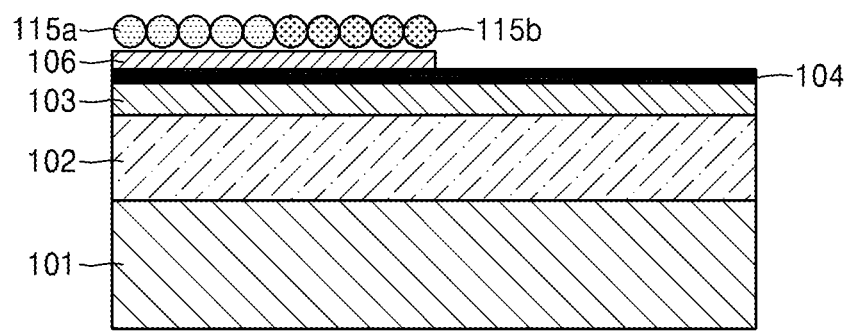

FIGS. 8A and 8B are schematic cross-sectional views illustrating processes of forming the quantum dot layer 115 in the electronic device 131 of FIG. 7A. Referring to FIG. 8A, the n-type quantum dots 115a are applied on a region of the graphene layer 104 by using a PDMS stamp (not shown). After that, as shown in FIG. 8B, the p-type quantum dots 115b may be applied on another region of the graphene layer 104 by using a PDMS stamp (not shown). Here, the region where the n-type quantum dots 114a are distributed and the region where the p-type quantum dots 115b are distributed may be adjacent to each other. Next, the drain electrode 108 and the source electrode 109 may be formed in a manner described with reference to FIGS. 4C and 4D.

Figure 9A:
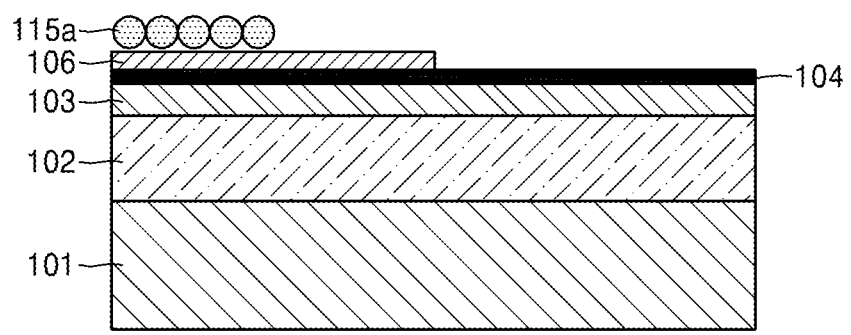
FIGS. 9A and 9B are schematic cross-sectional views illustrating processes of forming a quantum dot layer in the electronic device of FIG. 7B.
Figure 9B:
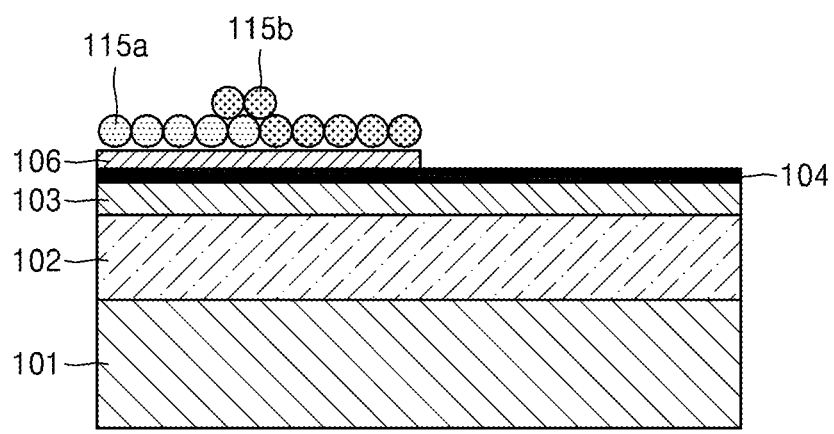

Also, FIGS. 9A and 9B are schematic cross-sectional views illustrating processes of forming the quantum dot layer 115 in the electronic device 132 of FIG. 7B. Referring to FIG. 9A, like in FIG. 8A, the n-type quantum dots 115a are applied on a region of the graphene layer 104 by using a PDMS stamp (not shown). Then, as shown in FIG. 9B, the p-type quantum dots 115b may be applied on another region of the graphene layer 104 by using a PDMS stamp. Here, the region where the n-type quantum dots 115a are distributed and the region where the p-type quantum dots 115b are distributed may overlap with each other partially. Therefore, in the process of FIG. 9B, some of the p-type quantum dots 115b may be disposed above the n-type quantum dots 115a. After that, the drain electrode 108 and the source electrode 109 may be formed in the manner described with reference to FIGS. 4C and 4D.

Figure 10:
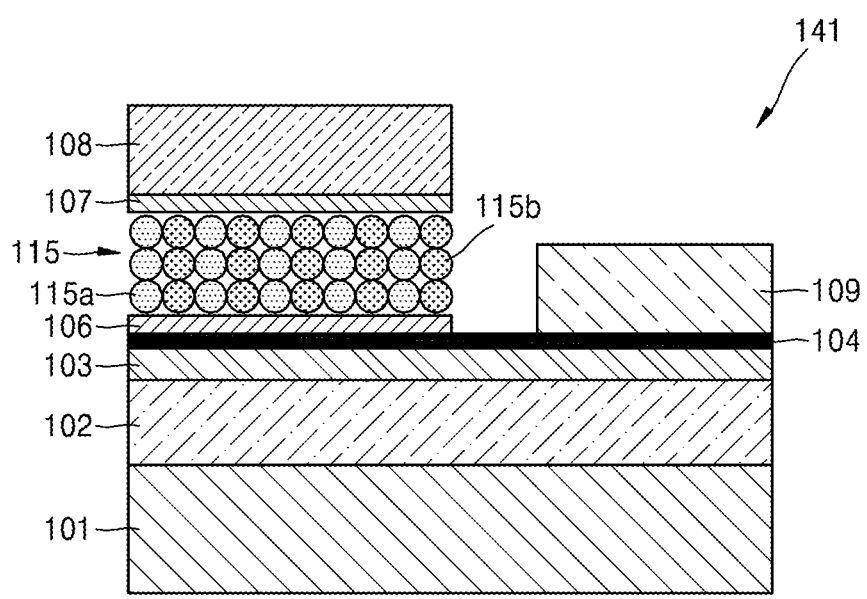
FIG. 10 is a schematic cross-sectional view of an electronic device according to example embodiments.

FIG. 10 is a schematic cross-sectional view of an electronic device 141 according to example embodiments. In FIGS. 7A through 7C, the n-type quantum dots 115a and the p-type quantum dots 115b are arranged in a single layer; however, in the electronic device 141 of FIG. 10, the n-type quantum dots 115a and the p-type quantum dots 115b are stacked in multiple layers. Here, an n-type current path is formed between the drain electrode 108 and the graphene layer 104 by using the n-type quantum dots 115a only, and a p-type current path is formed between the drain electrode 108 and the graphene layer 104 by using the p-type quantum dots 115b only. To do this, a plurality of n-type quantum dots 115a are stacked as multiple layers between the graphene layer 104 and the drain electrode 108, and a plurality of p-type quantum dots 115b may be stacked in multiple layers between the graphene layer 104 and the drain electrode 108. For example, as shown in FIG. 10, the plurality of n-type quantum dots 115a and the plurality of p-type quantum dots 115b that are stacked to connect the graphene layer 104 and the drain electrode 108 to each other may be stacked as pillars. In addition, the pillars formed by the plurality of n-type quantum dots 115a and the pillars formed by the plurality of p-type quantum dots 115b may be arranged alternately with each other along a surface direction of the graphene layer 104 and the drain electrode 108.

Figure 11:
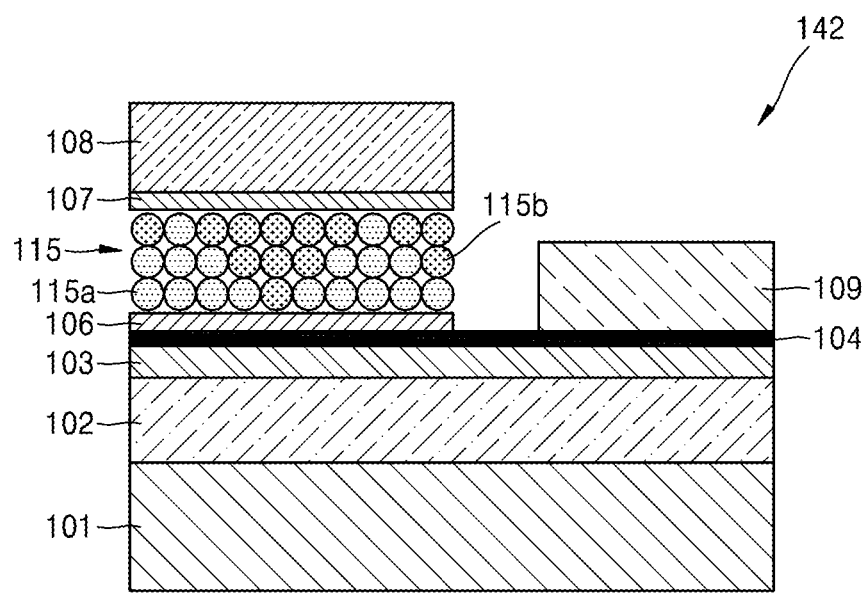
FIG. 11 is a schematic cross-sectional view of an electronic device according to example embodiments.

FIG. 11 is a schematic cross-sectional view of an electronic device 142 according to example embodiments. In the quantum dot layer 115 of the electronic device 142 shown in FIG. 11, the plurality of n-type quantum dots 115a are stacked as a pyramid so as to connect the graphene layer 104 and the drain electrode 108 to each other. To do this, the plurality of n-type quantum dots 115a may be stacked as pyramids from the graphene layer 104 up to the drain electrode 108. Also, the plurality of p-type quantum dots 115b may be stacked as a plurality of inverted pyramids that are complementary with the plurality of pyramids formed by the plurality of n-type quantum dots 115a. That is, the plurality of p-type quantum dots 115b may be stacked as inverted pyramids from the graphene layer 104 up to the drain electrode 108. For example, the pyramid formed by the plurality of n-type quantum dots 115a may contact the graphene layer 104 by a bottom surface and contact the drain electrode 108 by a vertex thereof, and the inverted pyramid formed by the plurality of p-type quantum dots 115b may contact the drain electrode 108 by a bottom surface and contact the graphene layer 104 by a vertex thereof. The electronic devices 141 and 142 shown in FIGS. 10 and 11 may operate as ambipolar devices.

Figure 12:
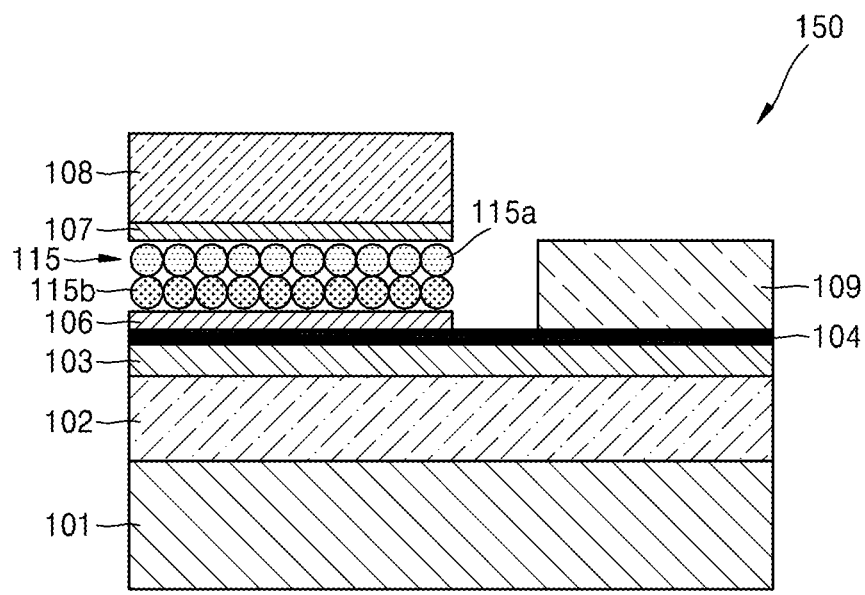
FIG. 12 is a schematic cross-sectional view of an electronic device according to example embodiments.

FIG. 12 is a schematic cross-sectional view of an electronic device 150 according to example embodiments. The quantum dot layer 115 of the electronic device 150 shown in FIG. 12 may include a plurality of p-type quantum dots 115b adjacent to the graphene layer 104 and a plurality of n-type quantum dots 115a adjacent to the drain electrode 108. In addition, the plurality of n-type quantum dots 115a may be stacked on the plurality of p-type quantum dots 115b. Otherwise, the plurality of p-type quantum dots 115b may be stacked on the plurality of n-type quantum dots 115a so that the plurality of p-type quantum dots 115b are adjacent to the drain electrode 108 and the plurality of n-type quantum dots 115a are adjacent to the graphene layer 104. In addition, in FIG. 12, the plurality of p-type quantum dots 115b form one layer and the plurality of n-type quantum dots 115a form one layer; however, the plurality of p-type quantum dots 115b and the plurality of n-type quantum dots 115a may respectively form a plurality of layers.

Therefore, the quantum dot layer 115 of the electronic device 150 has a p-n junction formed by the n-type quantum dots 115a and the p-type quantum dots 115b. The p-n junction prompts combination of the electrons and holes to improve a light emitting efficiency. In addition, the holes and electrons that are generated by absorbing external light may be efficiently separated from each other, and thereby improving a light absorbing efficiency. Since the p-n junction may be denoted as a diode, the electronic device 150 of FIG. 12 may be considered to include one transistor and one diode integrally formed with each other.

Figure 13:
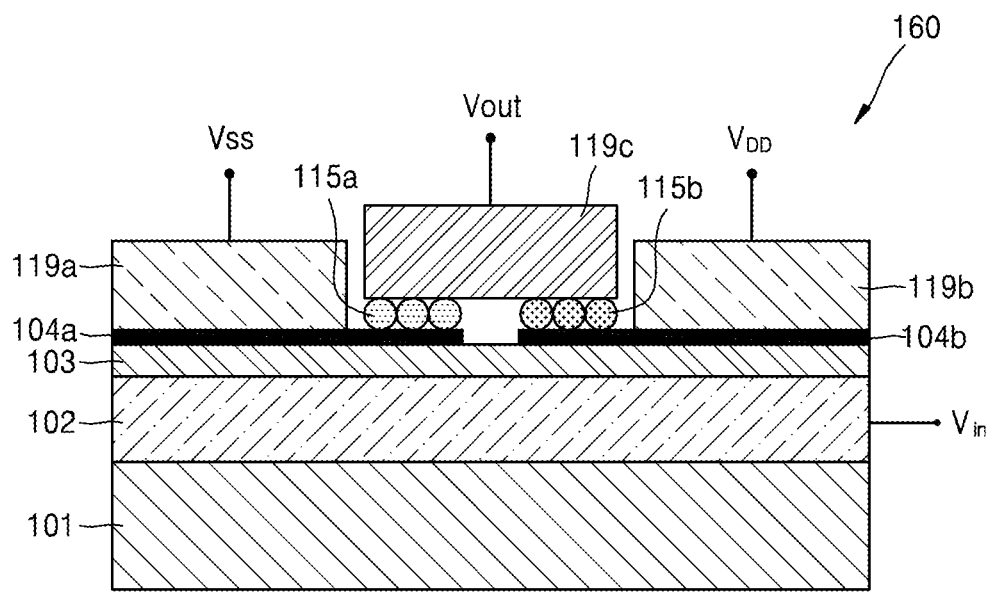
FIG. 13 is a schematic cross-sectional view of an electronic device according to example embodiments.

Examples in which the electronic device 100, 110, 120, 131, 132, 133, 141, 142, 150, or 200 operates as a switching device or a photovoltaic device are described above. However, the above embodiments may be applied to a logic device, as well as the photovoltaic device. For example, FIG. 13 is a schematic cross-sectional view of an electronic device 160 according to example embodiments. The electronic device 160 operates as an inverter device.

Referring to FIG. 13, the electronic device 160 includes the gate electrode 102, the gate insulating layer 103 disposed on the gate electrode 102, a first graphene layer 104a and a second graphene layer 104b separately disposed on an upper surface of the gate insulating layer 103, a plurality of n-type quantum dots 115a arranged on a partial region of the first graphene layer 104a, a plurality of p-type quantum dots 115b arranged on a partial region of the second graphene layer 104b, a first electrode 119a disposed to contact another region of the first graphene layer 104a, a second electrode 119b disposed to contact another region of the second graphene layer 104b, and a third electrode 119c disposed to contact the plurality of n-type quantum dots 115a and the plurality of p-type quantum dots 115b. Also, the electronic device 160 may further include a ground line Vss electrically connected to the first electrode 119a, a driving voltage line $V_{DD}$ electrically connected to the second electrode 119b, an input signal line Vin electrically connected to the gate electrode 102, and an output signal line Vout electrically connected to the third electrode 119c.

Here, the plurality of n-type quantum dots 115a form one n-type quantum dot layer, and the first graphene layer 104a and the n-type quantum dot layer may form one first channel layer. Also, the plurality of p-type quantum dots 115b form one p-type quantum layer, and the second graphene layer 104b and the p-type quantum layer may form a second channel layer. Therefore, it may be considered that the first channel layer and the second channel layer are separately disposed on the gate insulating layer 103. In addition, the first electrode 119a electrically contacts only the first channel layer, the second electrode 119b electrically contacts only the second channel layer, and the third electrode 119c electrically contacts both the first and second channel layers.

Therefore, the electronic device 160 shown in FIG. 13 is formed by one n-type transistor and one p-type transistor having the structure of the electronic device 100 shown in FIG. 1 in parallel with each other. That is, a gate of the n-type transistor and a gate of the p-type transistor are connected to each other, and a drain of the n-type transistor and a drain of the p-type transistor are connected to each other. In addition, the input signal line Vin is connected to the gates of the n-type transistor and the p-type transistor, the output signal line Vout is connected to the drains of the n-type transistor and the p-type transistor, the ground line Vss is connected to a source of the n-type transistor, and the driving voltage line Vdd is connected to a source of the p-type transistor.

Figure 14:
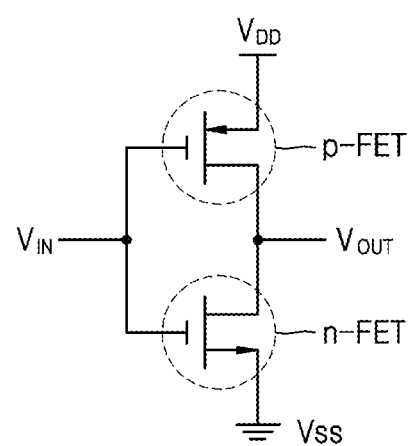
FIG. 14 is an equivalent circuit diagram of the electronic device of FIG. 13.

FIG. 14 is an equivalent circuit diagram of the electronic device 160 of FIG. 13. That is, the electronic device 160 of FIG. 13 may perform as an inverter device shown in FIG. 14. Referring to FIG. 14, when a positive voltage (that is, a logic signal "1") is applied to the input signal line Vin, the p-type transistor is turned off and the n-type transistor is turned on, and thus, the output signal line Vout is connected to the ground line Vss to output a logic signal "0". Also, when a negative voltage (that is, a logic signal "0") is applied to the input signal line Vin, the p-type transistor is turned on and the n-type transistor is turned off, and thus, the output signal line Vout is connected to the driving voltage line Vdd to output a logic signal "1".

Figure 15A:
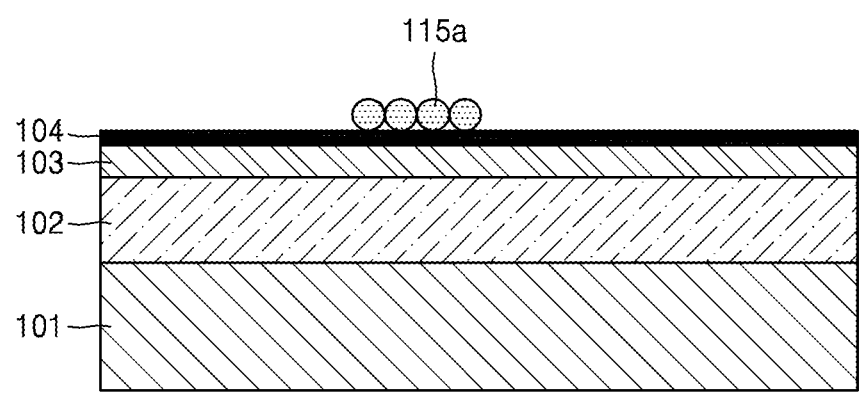
FIGS. 15A through 15D are schematic cross-sectional views illustrating processes of manufacturing the electronic device of FIG. 13 according to example embodiments.

FIGS. 15A through 15D are schematic cross-sectional views illustrating processes of manufacturing the electronic device 160 of FIG. 13 according to example embodiments. Referring to FIG. 15A, the gate insulating layer 103 and the graphene layer 104 are sequentially formed on the gate electrode 102. As described above, the graphene layer 104 on the gate insulating layer 103 may be formed by using a transfer method or a direct growth method. In addition, the plurality of n-type quantum dots 115a may be applied to a partial surface of the graphene layer 104 by using, for example, a PDMS stamp.

Figure 15B:
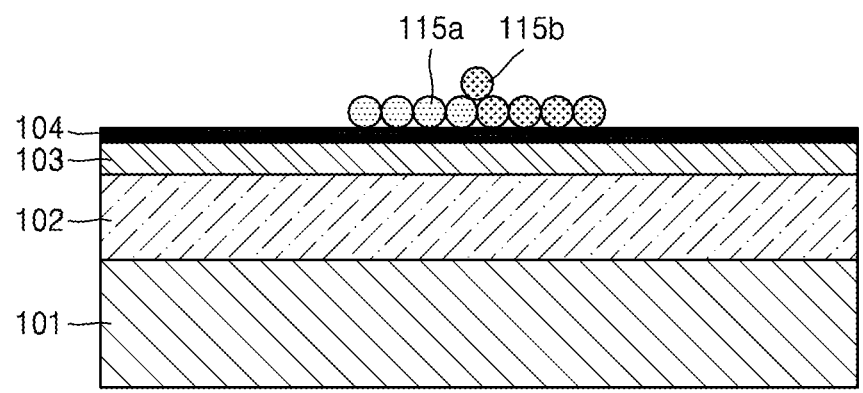

Next, referring to FIG. 15B, the plurality of p-type quantum dots 115b may be applied to another partial surface of the graphene layer 104 by using, for example, a PDMS stamp. In this process, as shown in FIG. 15B, some of the plurality of p-type quantum dots 115b may be arranged above the n-type quantum dots 115a while overlapping with the n-type quantum dots 115a. Otherwise, the plurality of p-type quantum dots 115b may be applied to be apart a predetermined interval from the plurality of n-type quantum dots 115a.

Figure 15C:
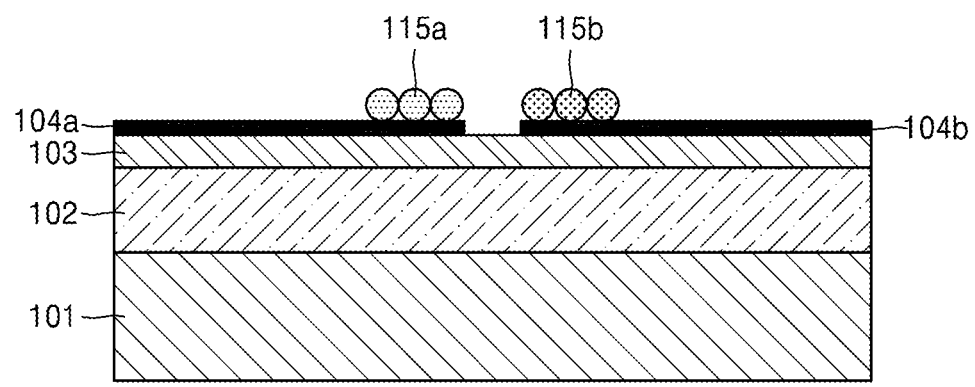

After that, referring to FIG. 15C, a region between the n-type quantum dots 115a and the p-type quantum dots 115b may be etched and removed. The etching may be performed until the gate insulating layer 103 is exposed after penetrating through the graphene layer 104. A trench 155 may be formed by the etching process. The trench 155 may completely separate the n-type quantum dots 115a from the p-type quantum dots 115b, and may divide the graphene layer 104 into two parts. Accordingly, the first graphene layer 104a and the second graphene layer 104b are formed.

Figure 15D:
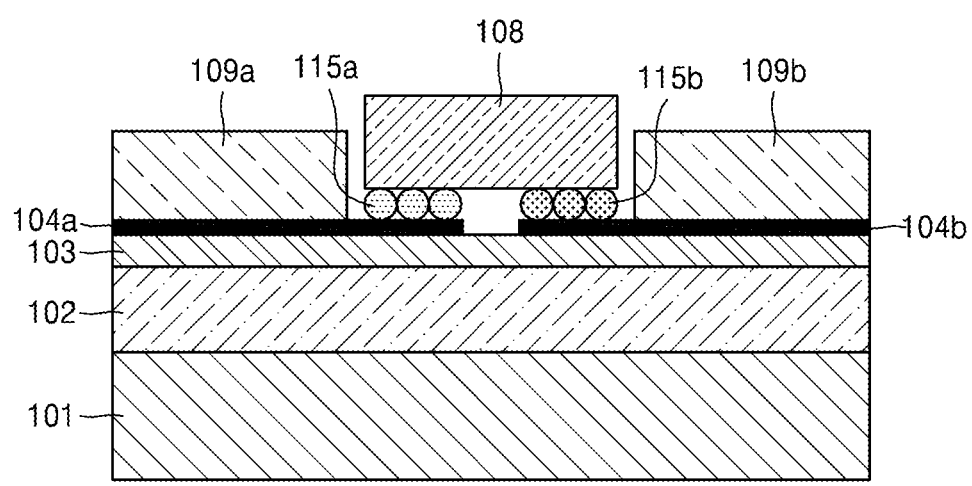

Referring to FIG. 15D, the first through third electrodes 119a, 119b, and 119c may be formed through a deposition process and a patterning process. For example, a conductive material is deposited so as to cover the first graphene layer 104a, the second graphene layer 104b, the n-type quantum dots 115a, and the p-type quantum dots 115b, and then, the conductive material is partially removed by an etching process so as to separate the first electrode 119a and the third electrode 119c from each other and separate the second electrode 119b and the third electrode 119c from each other.

Figure 16A:
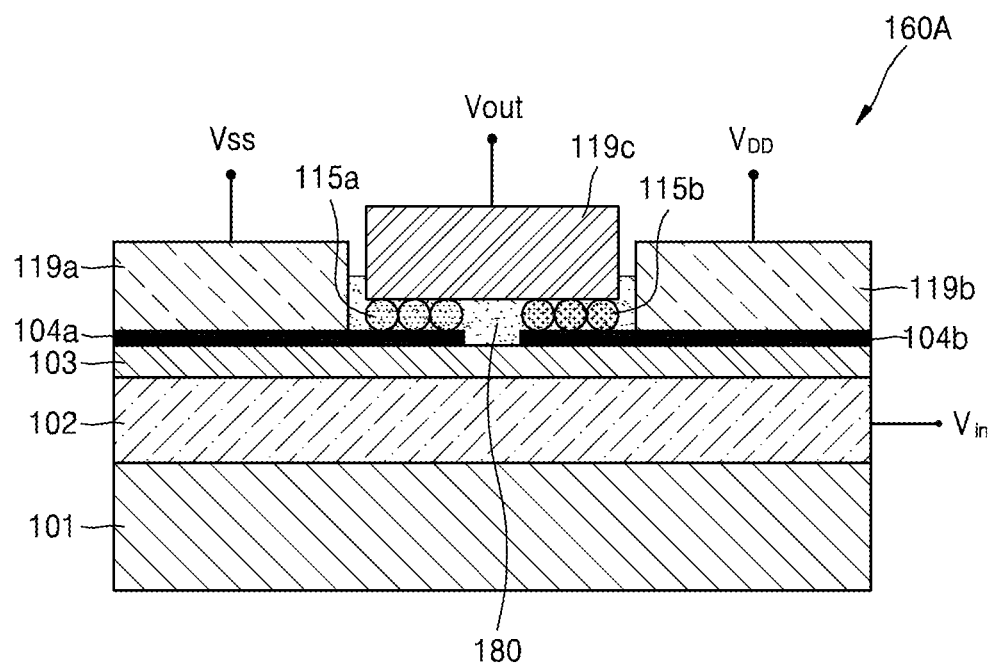
FIGS. 16A and 16B are schematic cross-sectional views of electronic devices according to example embodiments
Figure 16B:
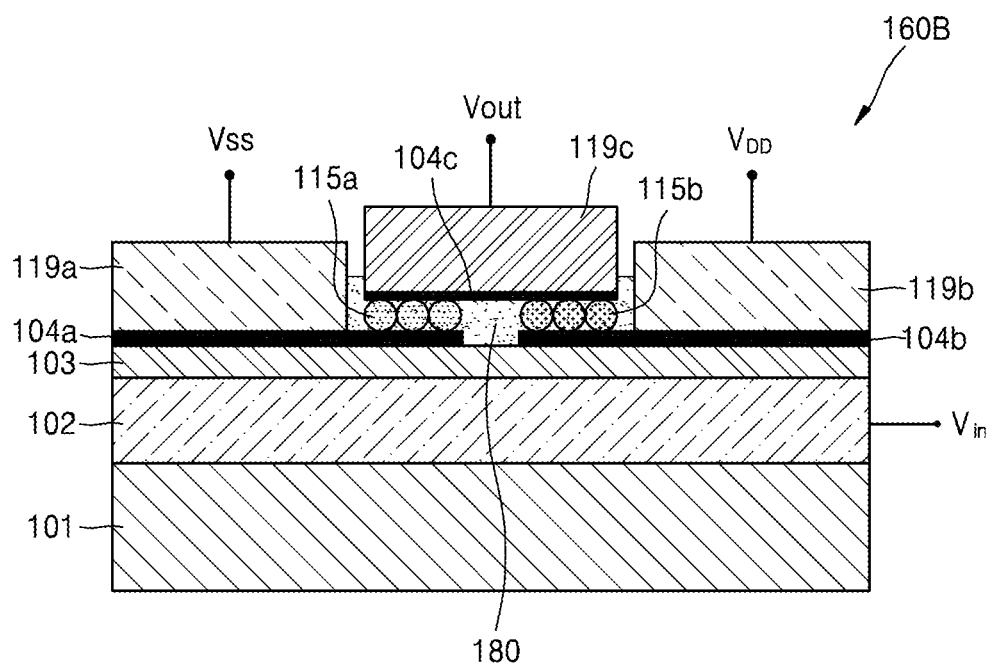

FIGS. 16A and 16B are schematic cross-sectional views of electronic devices according to example embodiments.

Referring to FIG. 16A, an electronic device 160A may be the same the as the electronic device 160 described previously with respect to FIG. 13, except a second gate insulating layer 180 may be arranged between the gate insulating layer 103 and the third electrode 119c. The second insulating layer 180 may be made of the same material as the gate insulating layer.

Referring to FIG. 16B, an electronic device 160B may be the same as the electronic device 160A in FIG. 16A, except the electronic device 160B may further include a third graphene layer 104c on the plurality of n-type quantum dots 115a and the plurality of p-type quantum dots 115b. In this case, the third electrode 119c may be disposed to contact the third graphene layer 104c.

It should be understood that the exemplary embodiments described therein should be considered in a descriptive sense only and not for purposes of limitation. Descriptions of features or aspects within each embodiment should typically be considered as available for other similar features or aspects in other embodiments.

While some example embodiments have been particularly shown and described, it will be understood by those of ordinary skill in the art that various changes in form and details may be made therein without departing from the spirit and scope as defined by the following claims.

What is claimed is:

1. An electronic device comprising:
    a channel layer including a graphene layer electrically contacting a quantum dot layer, the quantum dot layer including a plurality of quantum dots;
    a first electrode and a second electrode electrically connected to the channel layer, respectively, the first electrode being a source electrode or a drain electrode, the first electrode being a source electrode or a drain electrode, the first electrode being arranged so the quantum dot layer is between the graphene layer and a surface of the first electrode that faces the graphene layer;
    a gate electrode configured to control an electric current between the first electrode and the second electrode via the channel layer; and
    a gate insulating layer over the gate electrode and under the channel layer, wherein
    the quantum dot layer is on only a partial region of the graphene layer,
    the first electrode contacts the quantum dot layer, and
    the second electrode directly contacts the graphene layer;
    a gate electrode configured to control an electric current between the first electrode and the second electrode via the channel layer; and
    a gate insulating layer over the gate electrode and under the channel layer, wherein
    the quantum dot layer is on only a partial region of the graphene layer,
    the first electrode contacts the quantum dot layer, and
    the second electrode directly contacts the graphene layer.

2. The electronic device of claim 1, wherein the quantum dot layer includes a plurality of first quantum dots and a plurality of second quantum dots that are different from the plurality of first quantum dots.

3. The electronic device of claim 2, wherein
    the plurality of first quantum dots are a first conductive type material,
    the plurality of second quantum dots are a second conductive type material that is opposite to the first conductive type material,
    a value of a conduction band of the plurality of first quantum dots is less than a Fermi energy value of the graphene layer, and
    a value of a valence band of the plurality of second quantum dots is greater than the Fermi energy value of the graphene layer.

4. The electronic device of claim 2, wherein
    the plurality of first quantum dots contact a first region of the graphene layer,
    the plurality of second quantum dots contact a second region of the graphene layer, and
    the second region is different than the first region.

5. The electronic device of claim 4, wherein at least one of the plurality of first quantum dots are on top of a corresponding one of the plurality of second quantum dots.

6. The electronic device of claim 2, wherein
    the plurality of first quantum dots and the plurality of second quantum dots are randomly mixed, and
    each of the plurality of first quantum dots and the plurality of second quantum dots contacts the graphene layer.

7. The electronic device of claim 2, wherein
    the plurality of first quantum dots are stacked as multiple layers between the graphene layer and the first electrode, and
    the plurality of second quantum dots are stacked as multiple layers between the graphene layer and the first electrode.

8. The electronic device of claim 7, wherein
    the quantum dot layer includes a plurality of first pillars and a plurality of second pillars,
    each one of the plurality of first pillars is defined by a number of the plurality of first quantum dots stacked on top of each other,
    the plurality of first pillars connect the graphene layer and the first electrode to each other, and
    each one of the plurality of second pillars is defined by a number of the plurality of second quantum dots stacked on top of each other, the plurality of second pillars connect the graphene layer and the first electrode to each other, and
the plurality of first pillars and the plurality of second pillars are alternately arranged between the graphene layer and the first electrode.

9. The electronic device of claim 7, wherein
the quantum dot layer includes a plurality of first pyramid structures and a plurality of second pyramid structures,
each one of the plurality of first pyramid structure is defined by a number of the plurality of first quantum dots,
the plurality of first pyramid structures connect the graphene layer and the first electrode to each other,
each one of the plurality of second pyramid structures is defined by a number of the plurality of second quantum dots,
the plurality of second pyramid structures connect the graphene layer and the first electrode to each other, and
the plurality of first pyramid structures are arranged to be complementary with the plurality of second pyramid structures.

10. The electronic device of claim 1, further comprising:
a substrate, wherein
the gate electrode is on the substrate,
the gate insulating layer is on the gate electrode, and
the graphene layer is on the gate insulating layer.

11. The electronic device of claim 1, wherein some of the plurality of quantum dots in the quantum dot layer have different bandgaps from each other.

12. The electronic device of claim 1, wherein
the quantum dot layer is between the graphene layer and the first electrode,
the quantum dot layer includes a plurality of first conductive type quantum dots contacting the graphene layer and a plurality of second conductive type quantum dots contacting the first electrode,
the second conductive type is opposite the first conductive type, and
the plurality of second conductive type quantum dots are stacked on the plurality of first conductive type quantum dots.

13. An image sensor comprising:
a plurality of sensor pixels configured to sense light, wherein
the plurality of sensor pixels are arranged in an array,
each of the plurality of sensor pixels includes an electronic device according to claim 1, and
the plurality of sensor pixels include a first sensor pixel and a second sensor pixel having different absorption wavelengths from each other, based on an absorption wavelength of the plurality of quantum dots in the first sensor pixel being different than an absorption wavelength of the plurality of quantum dots in the second sensor pixel.

14. A display apparatus comprising:
a plurality of display pixels configured to emit light, wherein
the plurality of display pixels are arranged in an array,
each of the plurality of display pixels include an electronic device according to claim 1, and
the plurality of display pixels include includes a first display pixel and a second display pixel configured to emit light of different wavelengths from each other, based on an emission characteristic of the plurality of quantum dots in the first display pixel being different than an emission characteristic of the plurality of quantum dots in the second display pixel.

15. The electronic device of claim 1, wherein
the first electrode is on top of the quantum dot layer, and
the second electrode is spaced apart from the quantum dot layer.

16. An electronic device comprising:
a channel layer including a graphene layer electrically contacting a quantum dot layer, the quantum dot layer including a plurality of quantum dots;
a first electrode and a second electrode electrically connected to the channel layer, respectively, the first electrode being a source electrode or a drain electrode;
a gate electrode configured to control an electric current between the first electrode and the second electrode via the channel layer;
a gate insulating layer over the gate electrode and under the channel layer; and
at least one of a first transport layer and a second transport layer, wherein
the first transport layer is between the graphene layer and the quantum dot layer,
the second transport layer is between the quantum dot layer and the first electrode,
the quantum dot layer is on only a partial region of the graphene layer,
the first electrode contacts the quantum dot layer, and
the second electrode directly contacts the graphene layer,
the quantum dot layer is on only a partial region of the graphene layer,
the first electrode contacts the quantum dot layer, and
the second electrode directly contacts the graphene layer.

17. An electronic device comprising:
a graphene layer;
a quantum dot layer on
only one end of the graphene layer, the quantum dot layer including a plurality of inorganic quantum dots;
a first electrode being a source electrode or a drain electrode on the quantum dot layer;
a second electrode on an other end of the graphene layer directly contacting the graphene layer, the second electrode being spaced apart from the first electrode and the quantum dot layer
a gate electrode; and
a gate insulating layer over the gate electrode and under the graphene layer, wherein
the graphene layer and the quantum dot layer define a channel layer,
the channel layer contact the gate insulating layer,
the gate insulating layer contacts the gate electrode, and
the gate electrode is configured to control an electric current between the first electrode
and the second electrode via the channel layer.

18. A photovoltaic device comprising:
a battery cell configured to convert light energy into electrical energy,
the battery cell including an electronic device according to claim 17,
the quantum dot layer and the graphene layer of the electronic device defining a channel layer of the battery cell,
at least two of the plurality of inorganic quantum dots having different bandgaps from each other, and
the first electrode and the second electrode being electrically connected to the channel layer, respectively.

19. The photovoltaic device of claim 18, wherein
the quantum dot layer is on a partial region of the graphene layer,
the first electrode is contacts the quantum dot layer, and
the second electrode contacts the graphene layer.

20. The photovoltaic device of claim 18, wherein
the quantum dot layer includes a first quantum dot layer on a first region of the graphene layer and a second quantum dot layer on a second region of the graphene layer,
the second region is different than the first region,
the first electrode is on the first quantum dot layer, and
the second electrode is disposed on the second quantum dot layer.

21. An inverter device comprising:
a gate electrode;
a gate insulating layer on the gate electrode;
an electronic device according to claim 17, the quantum dot layer of the electronic device being a first quantum dot layer, the graphene layer of the electronic device being a first graphene layer on the gate insulating layer, the first quantum dot layer and the first graphene layer defining a first channel layer;
a second channel layer on the gate insulating layer, the second channel layer spaced apart from the first channel layer and electrically connected to the first channel layer by the first electrode, the second channel layer including a second graphene layer and a second plurality of inorganic quantum dots, the second plurality of inorganic quantum dots between the second graphene layer and the first electrode; and
a third electrode on the second graphene layer and spaced apart from the first electrode and the second quantum dot layer.

22. The inverter device of claim 21, wherein
the first electrode contacts the first graphene layer,
the second electrode contacts the second graphene layer, and
the third electrode contacts both the first quantum dot layer and the second quantum dot layer.

23. The inverter device of claim 22, further comprising:
a ground line electrically connected to the first electrode;
a driving voltage line electrically connected to the second electrode;
an input signal line electrically connected to the gate electrode; and
an output signal line electrically connected to the third electrode.

24. The electronic device of claim 17, wherein
the plurality of inorganic quantum dots include a first plurality of inorganic quantum dots and a second plurality of inorganic quantum dots, and
at least one of a band gap and a material of the first plurality of inorganic quantum dots is different than that of second plurality of inorganic quantum dots.

25. The electronic device of claim 17, further comprising:
at least one of a first transport layer and a second transport layer, wherein
the first transport layer is on the graphene layer between the first electrode and the quantum dot layer, and
the second transport layer is on the quantum dot layer.

* * * * *